(12) United States Patent
McKenzie et al.

(10) Patent No.: US 7,043,601 B2
(45) Date of Patent: *May 9, 2006

(54) PRIORITY ENCODER CIRCUIT AND METHOD

(75) Inventors: Robert McKenzie, Ottawa (CA); Valerie L. Lines, Ottawa (CA)

(73) Assignee: MOSAID Technologies Incorporated, Kanata (CA)

(*) Notice: Subject to any disclaimer, the term of this patent is extended or adjusted under 35 U.S.C. 154(b) by 322 days.

This patent is subject to a terminal disclaimer.

(21) Appl. No.: 10/742,926

(22) Filed: Dec. 23, 2003

(65) Prior Publication Data

US 2004/0139275 A1 Jul. 15, 2004

Related U.S. Application Data

(63) Continuation of application No. 09/954,074, filed on Sep. 18, 2001, now Pat. No. 6,693,814.

(30) Foreign Application Priority Data

Sep. 29, 2000 (CA) .................................... 2321466

(51) Int. Cl.
*G06F 12/00* (2006.01)
*G11C 15/00* (2006.01)

(52) U.S. Cl. ........................ 711/108; 711/220; 365/49

(58) Field of Classification Search ................ 711/100, 711/104, 154, 158, 220; 340/825.5; 341/50; 365/49, 189.08, 230.03

See application file for complete search history.

(56) References Cited

U.S. PATENT DOCUMENTS

| | | | | |
|---|---|---|---|---|
| 3,701,977 A | * | 10/1972 | Mendelson et al. ......... | 711/126 |
| 5,046,046 A | * | 9/1991 | Sweha et al. .......... | 365/185.04 |
| 5,311,462 A | * | 5/1994 | Wells ........................... | 365/49 |
| 5,568,416 A | | 10/1996 | Kawana et al. | |
| 5,619,446 A | * | 4/1997 | Yoneda et al. ................. | 365/49 |
| 5,726,942 A | * | 3/1998 | Yoneda et al. .............. | 365/208 |
| 5,964,857 A | | 10/1999 | Srinivasan et al. | |
| 5,973,950 A | | 10/1999 | Shindo | |
| 6,044,005 A | | 3/2000 | Gibson et al. | |
| 6,069,573 A | | 5/2000 | Clark, II et al. | |
| 6,070,223 A | | 5/2000 | Yoshizawa et al. | |
| 6,268,807 B1 | * | 7/2001 | Miller et al. ................... | 341/50 |
| 6,392,910 B1 | | 5/2002 | Podaima et al. | |
| 6,462,694 B1 | | 10/2002 | Miyatake | |
| 6,563,754 B1 | * | 5/2003 | Lien et al. ................... | 365/222 |

* cited by examiner

*Primary Examiner*—Tuan V. Thai
(74) *Attorney, Agent, or Firm*—Shin Hung; Borden Ladner Gervals LLP

(57) ABSTRACT

A system and method for high speed generation of a global address corresponding to the highest priority active matchline sense output signal received after a CAM search-and-compare operation is disclosed. A priority encoder having blocks of multiple match resolver circuits arranged in a logical order of priority receives a plurality of active matchline sense output signals. Each block of multiple match resolver circuits generates a flag signal and a local address corresponding to the highest priority active matchline sense output signal received. Control logic receives flag signals from the multiple match resolver circuits, and identifies the highest priority multiple match resolver circuit that has received an active matchline sense output signal. The control logic then disables all lower priority multiple match resolver circuits such that only the local address generated by the highest priority multiple match resolver circuit is passed by the priority encoder. The flag signals are also decoded to provide a logical address of the highest priority multiple match resolver circuit. The passed local address and the logical address of the highest priority multiple match resolver circuit are concatenated to provide the global address of the highest priority active matchline sense output signal received by the priority encoder.

13 Claims, 15 Drawing Sheets

PRIORITY ENCODER CIRCUIT AND METHOD

This application is a continuation of U.S. application Ser. No. 09/954,074 filed Sep. 18, 2001 now U.S. Pat. No. 6,693,814, claiming priority from Canadian Application No. 2,321,466 filed Sep. 29, 2000, the contents of which are incorporated by reference in their entirety.

FIELD OF THE INVENTION

The present invention relates to content addressable memory (CAM). In particular, the present invention relates to a priority encoder and method for high speed encoding of input data signals into addresses in accordance with predetermined priorities.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not.

A typical CAM block diagram is shown in FIG. 1. The CAM 10 includes a matrix, or array 100, of CAM cells (not shown) arranged in rows and columns. For a ternary CAM, the cells are typically either DRAM or SRAM type, and store one of three states: logic "1", logic "0" and "don't care", as two bits of data. An array of DRAM based ternary CAM cells, as described in Canadian Patent Application No. 2,266,062, filed Mar. 31, 1999, the contents of which are incorporated herein by reference, have the advantage of occupying significantly less silicon area than their SRAM based counterparts. The description of the operation of the ternary DRAM cell is detailed in the aforementioned reference. A predetermined number of CAM cells in a row store a word of data. An address decoder 12 is used to select any row within the CAM array 100 to allow data to be written into or read out of the selected row. Although most commonly, data is written or loaded into the CAM and searched. Data access circuitry such as bitlines and column selection devices, are located within the array 100 to transfer data into and out of the array 100. Located within CAM array 100 for each row of CAM cells are matchline sense circuits (not shown) used for search-and-compare operations. The various registers 15 receive and hold data from the data I/O block 20 for search-and-compare operations, and other components of the CAM include the control circuit block 14, the flag logic block 16, the voltage supply generation block 18, various control and address registers 22, refresh counter 28 and JTAG block 24.

The matchline sense circuits are used during search-and-compare operations for outputting a result indicating a successful or unsuccessful match of a search word against the stored word in the row. The results for all rows are processed by the priority encoder 200 to output the address (Match Address) corresponding to the location of a matched word. The match address is stored in match address registers 25 before being output by the match address output block 26. The generation of the match address is relatively simple when there is only one stored word which matches the search word. However, when there are many stored words matching the search word, the priority encoder is still limited to provide only one match address. Hence, a rule is applied in which only the highest priority matching word is accepted, and all lesser priority matching words are ignored. Within the context of CAM's, the highest priority matching word is located at the lowest physical address in the CAM array and accordingly, the lowest priority matching word is located at the highest physical address in the CAM array. For example, if two words located at binary address 0001 and 1001 match the search word, the word stored at binary address 0001 would have the highest priority. In general, the priority encoder 200 of the CAM is responsible for determining the highest priority matching word among many matching words, and generating the address corresponding to the highest priority matching word.

A more detailed block diagram of a typical priority encoder 200 is shown in FIG. 2. The priority encoder includes a multiple match resolver block 204 and a ROM address decoder block 206 for generating an 8-bit address. Multiplexors 202 receive matchline sense output signals ML_OUT0 to ML_OUT255 from the matchline sense circuits, and an empty data signal EMPTY0 to EMPTY255. A common control signal SELECT EMPTY connected to each multiplexor 202 selects empty data for input to the multiple match resolver block 204 when active. However, for the purposes of the following discussion, it is assumed that SELECT EMPTY is inactive, and only the matchline sense output signals are passed to the multiple match resolver block 204. For each input of the multiple match resolver block 204, there is exactly one corresponding output 208 supplied to ROM decoder block 206. In general operation, when multiple match resolver block 204 receives one or more active ML_OUT signals, ic. when a match between the stored word in the CAM and search word occurs, multiple match resolver block 204 determines which stored word has the highest priority and activates the corresponding output signal 208. ROM block 206 then generates an 8-bit address corresponding to the active output signal 208. Although the input signals are arranged in sequential order, it is the logical order assigned to the physical connection of the signal within multiple match resolver block 204 which is significant. In other words, if it is understood that ML_OUT0 is the highest priority location and ML_OUT255 is the lowest priority location, then the ML_OUT inputs could be connected in any order as long as the internal connections within multiple match resolver block 204 are correspondingly assigned according to their logical priority.

A disadvantage with the scheme shown in FIG. 2 is the long duration of time required to produce the match address after the matchline sense output signals are presented to the multiple match resolver block 204. The delay in receiving the match address is approximately 12 ns, a significant amount of time which delays subsequent CAM operations. Most of this delay is contributed by the memory access operation of the ROM.

It is therefore desirable to provide a searchline control circuit capable of operating at high speed to improve CAM performance.

SUMMARY OF THE INVENTION

It is an object of the present invention to obviate or mitigate at least one disadvantage of the prior art. In particular, it is an object of the present invention to provide a high speed priority encoder circuit, a method of using such a circuit, and a content addressable memory using such a priority encoding circuit, that generates highest priority match addresses quickly.

In a first aspect, the present invention provides a priority encoder for generating an address of a highest priority active data signal. The priority encoder has a first stage for receiving a plurality of active data signals, and generates at least one flag signal and at least one first address portion corresponding to at least one active data signal. The priority encoder includes a second stage for receiving the at least one flag signal in a logical order of priority for generating a second address portion corresponding to a highest priority flag signal. The second stage also enables passage of its corresponding first address portion from the first stage.

In an embodiment of the present invention, the first stage of the priority encoder includes a plurality of multiple match resolver circuits. Each multiple match resolver circuit of the first stage receives a set of the plurality of active data signals for generating the at least one flag signal and the first address portion corresponding to the highest priority active data signal. In a presently preferred embodiment, the at least one flag signal is one of a row and a column flag signal, and each multiple match resolver circuit is connected to common address lines for transferring the first address portion. The set of the plurality of active data signals includes 2 n active data signals, and the first address portion is n bits wide, where n is an integer greater than 0. In the presently preferred embodiment, the second stage includes at least one multiple match resolver circuit. The at least one multiple match resolver circuit receives at least one of the at least one flag signals for generating the second address portion corresponding to the highest priority flag signal.

In a further embodiment of the present invention, multiple match resolver circuits of the first stage are arranged as rows and columns in a logical order of priority, and the second stage is formed as a substantial column and row at approximately the centre of the rows and columns of multiple match resolver circuits respectively.

In yet another embodiment of the present invention, the second stage includes flag processing logic. The flag processing logic includes row priority logic and column priority logic for generating at least one row control signal and at least one column control signal corresponding to the at least one flag signal respectively. Additionally, the flag processing logic decodes the at least one row control signal and at least one column control signal to provide the second address portion. The column priority logic includes an address selection circuit for passing the first address portion corresponding to the highest priority column control signal.

In yet another embodiment of the present invention, each of the multiple match resolver circuits includes a control circuit. The control circuit overwrites the first address portion and the column flag signal in response to the row flag signal corresponding to the highest priority active data signal, such that the overwritten first address portion and the overwritten column flag signal are low logic levels.

A further aspect of the present invention provides a content addressable memory. The content addressable memory consists of an array of content addressable memory cells arranged in rows and columns, an address decoder for addressing rows of cells, write data circuitry for writing data to the cells, matchline sense circuitry for comparing the data stored in the cells with search data to provide active matchline sense output signals indicative of a match, and a priority encoder circuit for providing an address corresponding to the highest priority active matchline sense output signal. The priority encoder circuit further consists of a first stage for receiving the active matchline sense output signals in a logical order of priority. The first stage generates at least one flag signal and at least one first address portion corresponding to at least one active matchline sense output signal. The priority encoder circuit finally includes a second stage for receiving the at least one flag signal in a logical order of priority, and for generating a second address portion corresponding to a highest priority flag, and for enabling passage of its corresponding first address portion from the first stage.

In a further aspect of the present invention, there is provided a method for determining an address of a highest priority data signal from a plurality of data signals. The method consists of providing sets of data signals in a predetermined order of priority to a first stage priority encoder, resolving the highest priority data signal from each set of the data signals and generating lower significant bits of the address and flags corresponding to the highest priority data signals from each set of the data signals, resolving the highest priority flag of the flags in a second stage priority encoder for generating higher significant bits of the address, providing the lower significant bits of the address corresponding to the highest priority flag, and concatenating the lower significant bits of the address corresponding to the highest priority flag with the higher significant bits of the address to provide the address of the highest priority data signal. The step of resolving the highest priority data signal can include a step for generating row and column flags. The step of providing the lower significant bits of the address can include the step of setting the lower significant bits of the address corresponding to all lower priority flags to zero. The step of resolving the highest priority flag can include a step of generating an enable signal for allowing passage of the lower significant bits of the address corresponding to the highest priority flag.

A further aspect of the present invention provides a priority encoder for generating an address of a highest priority active data signal. The priority encoder consists of a plurality of multiple match resolver circuits arranged in rows and columns. Each multiple match resolver circuit receives a plurality of active data signals and generates a lower significant address corresponding to the highest priority active data signal, a row flag, and a column flag. The priority encoder also includes row priority logic associated with each row of multiple match resolver circuits for receiving the row flags, and for generating row control signals corresponding to the row having the highest priority row flag. The row control signals are operatively connected to the multiple match resolver circuits for inhibiting generation of the column flags and lower significant addresses corresponding to lesser priority rows The priority encoder further includes column priority logic associated with each column of multiple match resolver circuits and an address encoder. The column priority logic receives the column flags and lower significant addresses, and generates column control signals corresponding to the column having the highest priority column flag. The column control signals are operatively connected for inhibiting generation of the lower significant addresses corresponding to lesser priority columns and for generating the lower significant address corresponding to the highest priority column. The address encoder receives the row and column control signals and generates a higher significant address.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

In the design process for a semiconductor device, it is desirable to re-use standard blocks, or cells, of circuits in various combinations to form larger blocks of circuits which perform different functions. Such an approach eliminates the duplication of design engineering labour, and shortens the design cycle in an effort to bring the finished product quickly to market. There is also the advantage of reducing costs in the process. The priority encoder of the present invention is easily implemented and fully scalable for any CAM density by using standard cells of multiple match resolver circuits. Each multiple match resolver circuit consists of the same circuit elements and performs the same function, but are arranged in a novel manner with minimal supporting circuitry to form a fully functional priority encoder.

Figure 3:
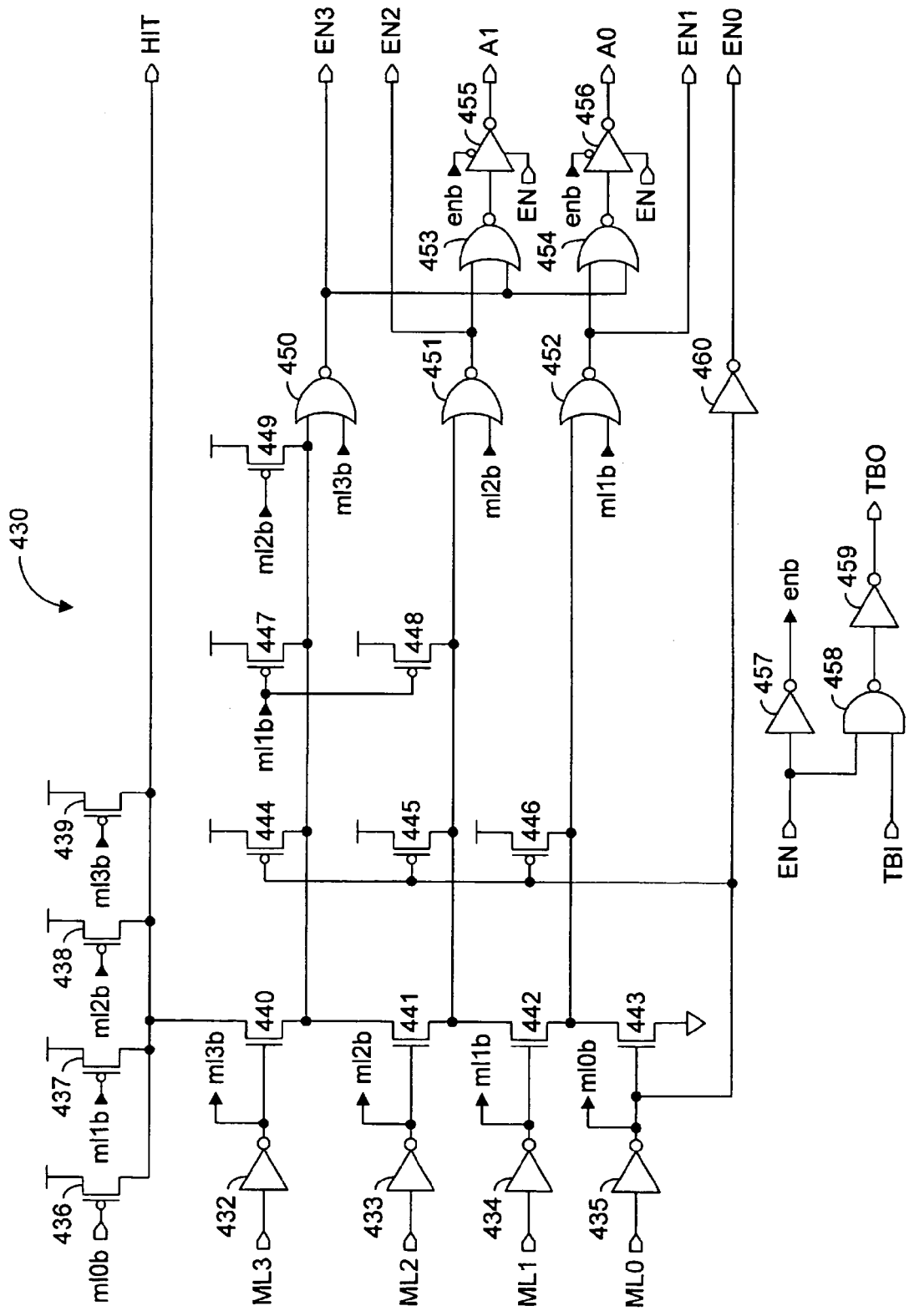
FIG. 3 shows the circuit schematic of a multiple match resolver circuit.

A schematic of a multiple match resolver circuit, or standard cell, is shown in FIG. 3. The multiple match resolver circuit of FIG. 3 is also a fully functional priority encoder which is used as a building block for all the priority encoder embodiments of the present invention. The multiple match resolver circuit 430 receives active input data signals, such as matchline sense output signals, in a positional order of priority, and generates an address corresponding to the active input data signal having the highest priority. Signal names in lower case are local to this circuit only, and signal names in upper case are connection ports to signals external to this circuit. In this particular embodiment, data appearing on the four input ports ML3–ML0 are inverted by inverters 432–435 respectively to provide respective signals ml3b, ml2b, ml1b and ml0b. P-channel transistors 436–439 and n-channel transistors 440–443 are connected in a NAND gate configuration for receiving the signals ml3b, ml2b, ml1b and ml0b. The shared source of p-channel transistors 436–439 drive output port HIT. A first intermediate output line is provided from the shared source-drain terminals of n-channel transistors 440 and 441, a second intermediate output line is provided from the shared source-drain terminals of n-channel transistors 441 and 442, and a third intermediate output line is provided from the shared source-drain terminals of n-channel transistors 442 and 443. P-channel masking transistors 444–446 having a common gate connected to ml0b are connected between the VDD power supply and each of the first, second, and third intermediate output lines respectively. P-channel masking transistors 447 and 448 having a common gate connected to ml1b are connected between VDD and each of the first and second intermediate output lines respectively. P-channel masking transistor 449 has a gate connected to ml2b and is connected between VDD and the first intermediate output line. The first, second and third intermediate output lines are further connected to one input of NOR gates 450–452 respectively, and the second inputs of NOR gates 450–452 are connected to signals ml3b, ml2b and ml1b respectively. It is noted that ml0b is connected directly to the input of inverter 460. NOR gates 450–452, and inverter 460 generate feedback enable signals EN3, EN2, EN1 and EN0 respectively, where EN3 is further connected to one input of NOR gates 453 and 454. EN2 is further connected to the second input of NOR gate 453 and EN1 is further connected to the second input of NOR gate 454. The outputs of NOR gates 453 and 454 are connected to tri-state inverters 455 and 456 respectively, for driving address ports A0 and A1 in response to a high logic level signal appearing on the EN input port. Input port EN is connected to inverter 457 to generate enb, and to one input of NAND gate 458. The second input of NAND gate 458 is connected to trace-back in input port TBI, and inverter 459 is connected to the output of NAND gate 458 to drive the trace-back out output port TBO. Circuit elements 432–449 form the data signal masking section of multiple match resolver circuit 430, and circuit elements 450–456 form the address encoding section of multiple match resolver circuit 430. The connections of ML0–ML3 are physically arranged such that any active, or high logic level, input signal appearing on port ML0 is assigned the highest priority and any active input signal appearing on port ML3 is assigned the lowest priority. Hence ML0–ML3 are arranged in a decreasing order of priority. The first, second and third intermediate output lines correspond with inputs appearing on ports ML3–ML1 respectively, and are grounded at the low logic level when their corresponding input ports receive a high logic level signal. However, if two or more input ports receive high logic level signals, then the masking transistors corresponding to the highest priority active port over-writes the low logic level of the intermediate output lines corresponding to lower priority active ports. Masking transistors 444–446 correspond to input port ML0, 447 and 448 correspond to input port ML1 and 449 corresponds to input port ML2. Additionally, the HIT signal is driven to a high logic level when at least one input port receives a high logic level signal, and only the feedback enable signal corresponding to the highest priority active port is driven to a high logic level. For example, if port ML1 is determined as receiving the highest priority active signal, then corresponding feedback enable signal EN1 is driven to the high logic level. The signal from output port HIT functions as a flag to indicate that the multiple match resolver circuit 430 has received at least one high logic level signal. The address decoding section of multiple match resolver circuit 430 merely decodes the first, second, third intermediate output lines and signals ml1$b$ –ml3$b$ to produce a two-bit address corresponding to the input port which received the highest priority signal. Table 1 below lists the input ports and their corresponding addresses.

TABLE 1

| Input port | A0 | A1 |
|---|---|---|
| ML0 | 0 | 0 |
| ML1 | 1 | 0 |
| ML2 | 0 | 1 |
| ML3 | 1 | 1 |

Figure 4:
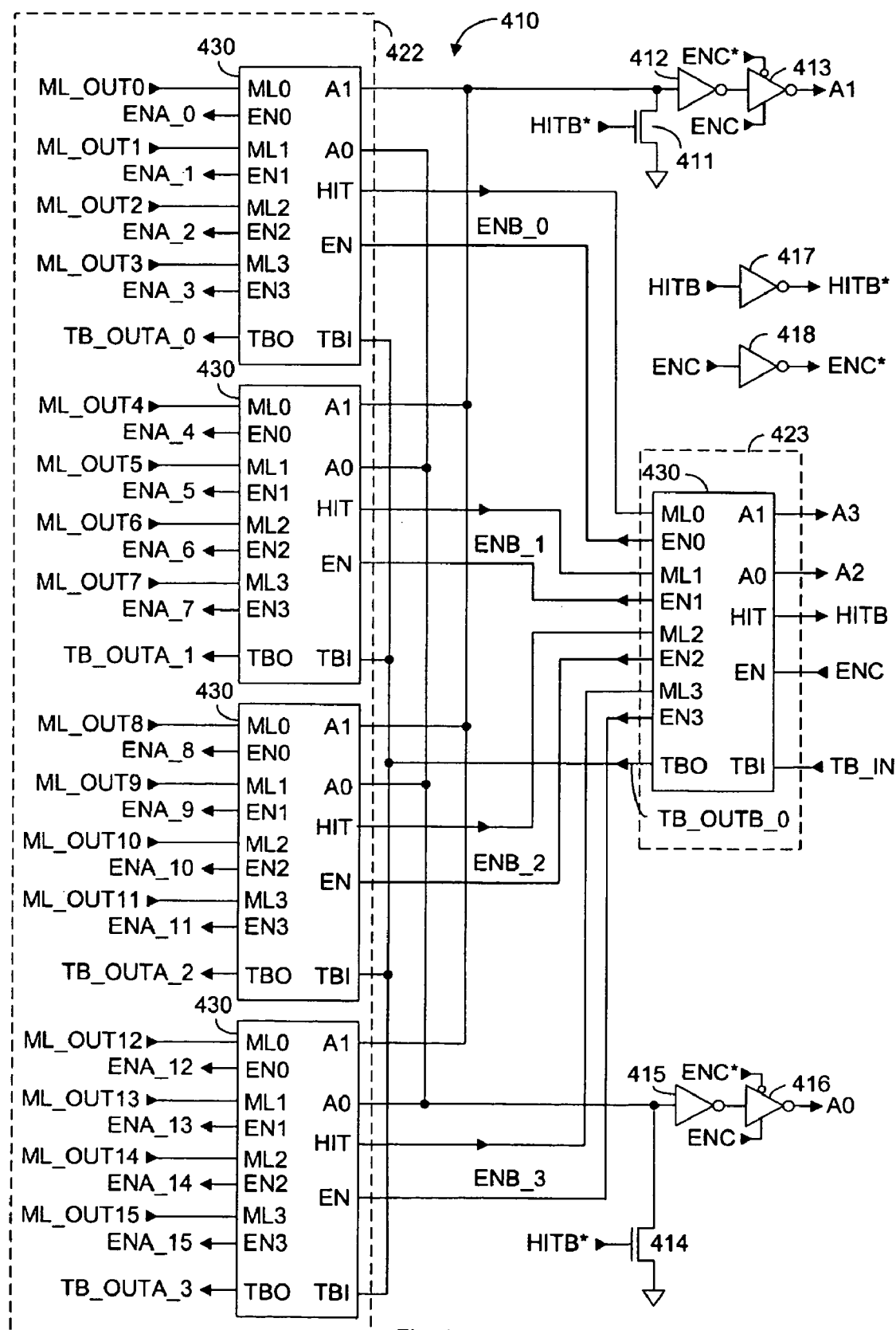
FIG. 4 shows a priority encoder unit according to a first embodiment of the present invention.

The block diagram of FIG. 4 shows a priority encoder unit according to a first embodiment of the present invention. Priority encoder unit 410 of FIG. 4 resolves the highest priority active input signal and generates a corresponding four-bit address, and is a larger scale multiple match resolver circuit relative to the MMRC of FIG. 3. The priority encoder unit 410 is made up of blocks of multiple match resolver circuits 430 from FIG. 3, arranged into two stages. First stage 422 consists of four multiple match resolver circuits 430 arranged in parallel for generating a first portion of the final address. For ease of illustration, the connections for the top-most multiple match resolver circuit 430 of first stage 422 are discussed. The multiple match resolver circuit 430 receives four matchline sense outputs ML_OUT0–ML_OUT3 on its respective input ports ML0–ML3, and generates first stage feedback enable signals ENA_0–ENA_3 through its respective output ports EN0–EN3. The input port EN receives second stage feedback enable signal ENB_0, and output port HIT provides a flag signal for the second stage of multiple match resolver circuit 430. Output address ports A1 and A0 are connected to their respective common address lines. The remaining three multiple match resolver circuits 430 are similarly connected to different signals, and their output address ports A1 and A0 are also connected to the common address lines. Multiple match resolver circuit 430 input ports TBI from first stage 422 are connected in common to the multiple match resolver circuit output port TBO of second stage 423, and provide traceback output signals TB_OUT_0 to TB_OUT_3 from their respective TBO output ports. Multiple match resolver circuit 430 of second stage 423 receives traceback input signal TB_IN. The trace back signals do not contribute to the address generation operation of multiple match resolver circuits 430. These signals are used by the CAM for other functions, and are therefore not described in any further detail. In the priority encoder unit 410, signal ML_OUT0 has the highest priority whereas ML_OUT15 has the lowest priority, hence the multiple match resolver circuits 430 of first stage 422 are arranged in a decreasing order of priority.

The second stage 423 consists of one multiple match resolver circuit 430 having its input ports ML0–ML3 connected to the HIT output ports from each multiple match resolver circuit 430 of first stage 422 for generating a second portion of the final address. Feedback enable output ports EN0–EN3 generate second stage enable signals ENB0–ENB3 which are connected to respective enable input ports EN of each multiple match resolver circuit 430 of first stage 422. Multiple match resolver circuit 430 of second stage 423 generates addresses A2, A3, flag HITB and receives enable signal ENC.

A tri-state buffer circuit consisting of n-channel pull down transistor 411, inverter 412 and tri-state inverter 413 is connected to the common address line for output address port A1. Similarly, an identical circuit consisting of n-channel pull down transistor 414, inverter 415 and tri-state inverter 416 is connected to the common address line for output address port A0. Both tri-state inverters 413 and 416 drive the logic levels appearing on their corresponding address as address signals A1 and A0 respectively, in response to enable signals ENC and ENC*. Tri-state inverters such as 413 and 416 are well known in the art and do not need to be described. The gates of n-channel pull down transistors 411 and 414 are connected to signal HITB*. Inverters 417 and 418 invert signals HITB and ENC to provide signals HITB* and ENC* respectively.

In the following description of the operation of the priority encoder unit 410, it is assumed that enable signal ENC and second stage feedback enable signals ENB_0–ENB_3 are held at the low logic level before the priority encoding operation begins. The common address lines connected to output address ports A0 and A1 are held at ground by n-channel transistors 414 and 411 respectively since flag signal HITB is currently at the inactive low logic level to drive HITB* to the high logic level. Each multiple match resolver circuit 430 from first stage 422 independently determines the highest priority active ML_OUT signal from its respective set of four ML_OUT signals received, and internally generates a two bit address corresponding to the highest priority active ML_OUT signal received. It should be noted that output address ports A1 and A0 do not assert their address signals onto the common address lines at this time since second stage feedback enable signals ENB_0–ENB_3 are not active. As described earlier for the multiple match resolver circuit 430 in FIG. 3, the flag generated by the HIT output port is driven high if the corresponding multiple match resolver circuit 430 has received at least one active ML_OUT signal. The multiple match resolver circuit 430 of second stage 423 receives the flags from each respective multiple match resolver circuit 430 of first stage 422, and determines which flag has the highest priority. Address bits A2 and A3 from output address ports A0 and A1 corresponding to the highest priority flag are internally generated, but are not driven onto signal lines A2 and A3 since enable signal ENC is inactive, and the flag signal HITB is driven to the high logic level. With HITB at the high logic level, n-channel transistors 411 and 414 are turned off, letting the common address lines connected to output address ports A0 and A1 float at the ground potential. Multiple match resolver circuit 430 of second stage 423 then drives one second stage feedback enable signal ENB corresponding to the highest priority flag to the high logic level.

The remaining three ENB signals remain in the inactive low logic level. The multiple match resolver circuit 430 of first stage 422, which receives the active ENB signal, transfers its two bit address onto the common address lines in response to the active ENB signal. After some predetermined time, enable signal ENC is driven to the high logic level, allowing tri-state inverters 413 and 416 to drive the logic levels on the common address lines as address signals A1 and A0. At the same time, output address ports A1 and A0 from multiple match resolver circuit 430 of second stage 423 transfers its two bit address as address signals A3 and A2 in response to enable signal ENC. In summary, multiple match resolver circuit 430 of the second stage 423 enables transfer, or output of the logical address of the multiple match resolver circuit 430 of first stage 422 that has received the highest priority active data signal. By concatenating address bits A1, A0 with A3, A2, the global address of the highest priority active data signal is obtained.

In a practical example, if ML_OUT3–ML_OUT15 are all active, each multiple match resolver circuit 430 of first stage 422 generates a flag signal from its HIT output port. According to Table 1 above, the active ML_OUT3 signal received by input port ML3 forces an A0, A1 address of 1,1. ML_OUT4, ML_OUT8 and ML_OUT12 are the highest priority active signals received by their respective multiple match resolver circuits 430, and each forces an A0, A1 address of 0,0. Multiple match resolver circuit 430 of second stage 423 receives all the active flag signals at its input ports ML0–ML3 and determines that the highest priority flag is received at input port ML0. Therefore, signal ENB_0 is driven to the high logic level for enabling transfer of the address 1,1 from multiple match resolver circuit 430 receiving the active ML_OUT3 signal. Additionally, output address ports A0, A1 from second stage multiple match resolver circuit 430 generates an address of 0,0. Hence, the final address of the highest priority active ML_OUT3 signal is the four bit address value 0,0,1,1 (A3, A2, A1, A0). This is consistent with the understanding that four address bits are required to represent each of the sixteen possible positions, and the four bit address value of 0,0,1,1 represents the fourth physical position in which the highest priority active signal, ML_OUT3, was received. Although first stage feedback enable signals ENA_0–ENA_15 were not used in this embodiment, they could be employed in a larger system where the priority encoder unit 410 is sequentially cascaded with other identical priority encoder units to encode very large numbers of data signals. Alternatively, each multiple match resolver circuit 430 may be scaled to receive more than just four data inputs for larger scale applications. Since the priority encoder of the present embodiment is implemented in logic circuitry, priority encoding operations are executed at high speed. This design takes advantage of fabrication processes optimized for high speed logic.

Figure 5:
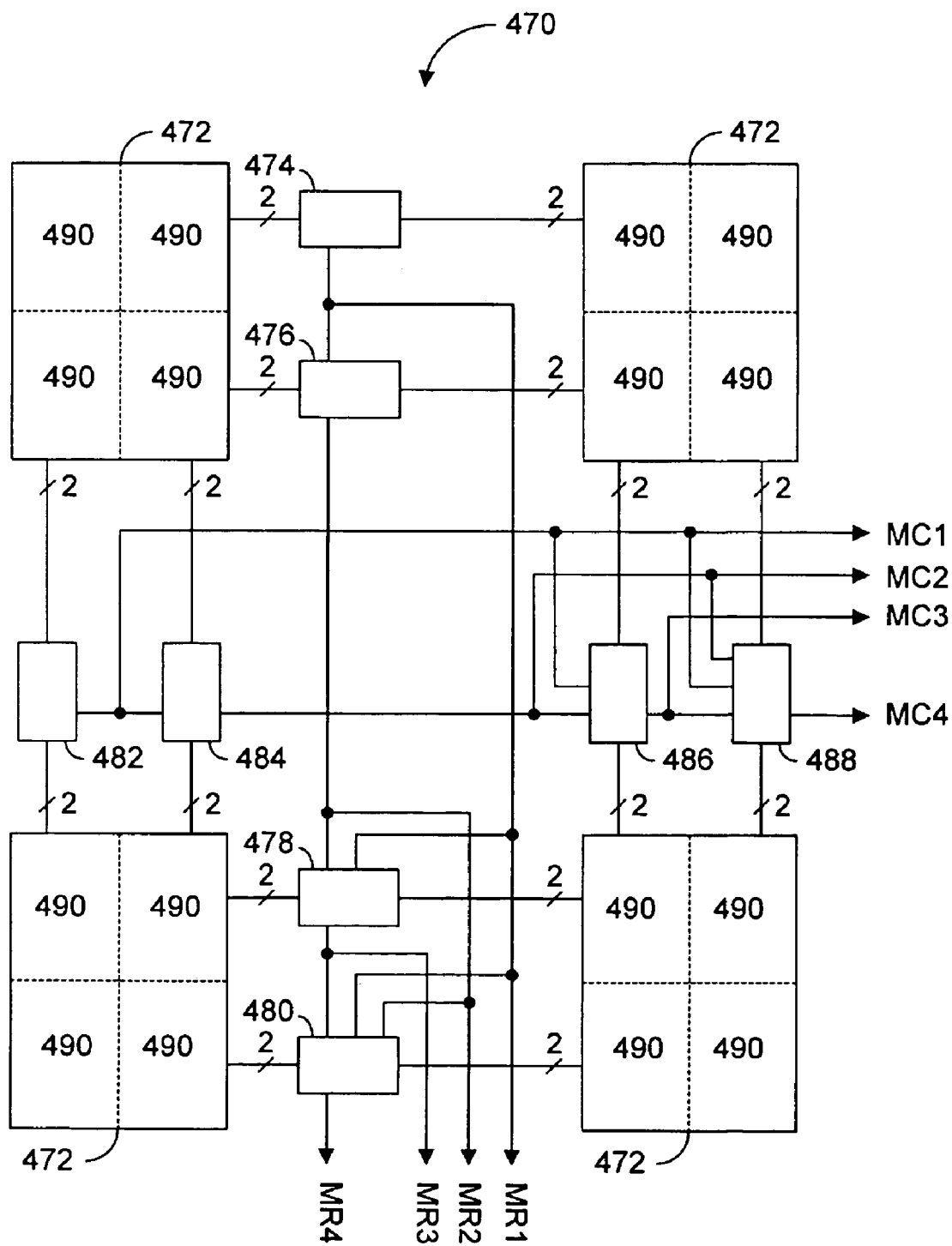
FIG. 5 shows a block diagram of a priority encoder according to a second embodiment of the present invention.
Figure 9:
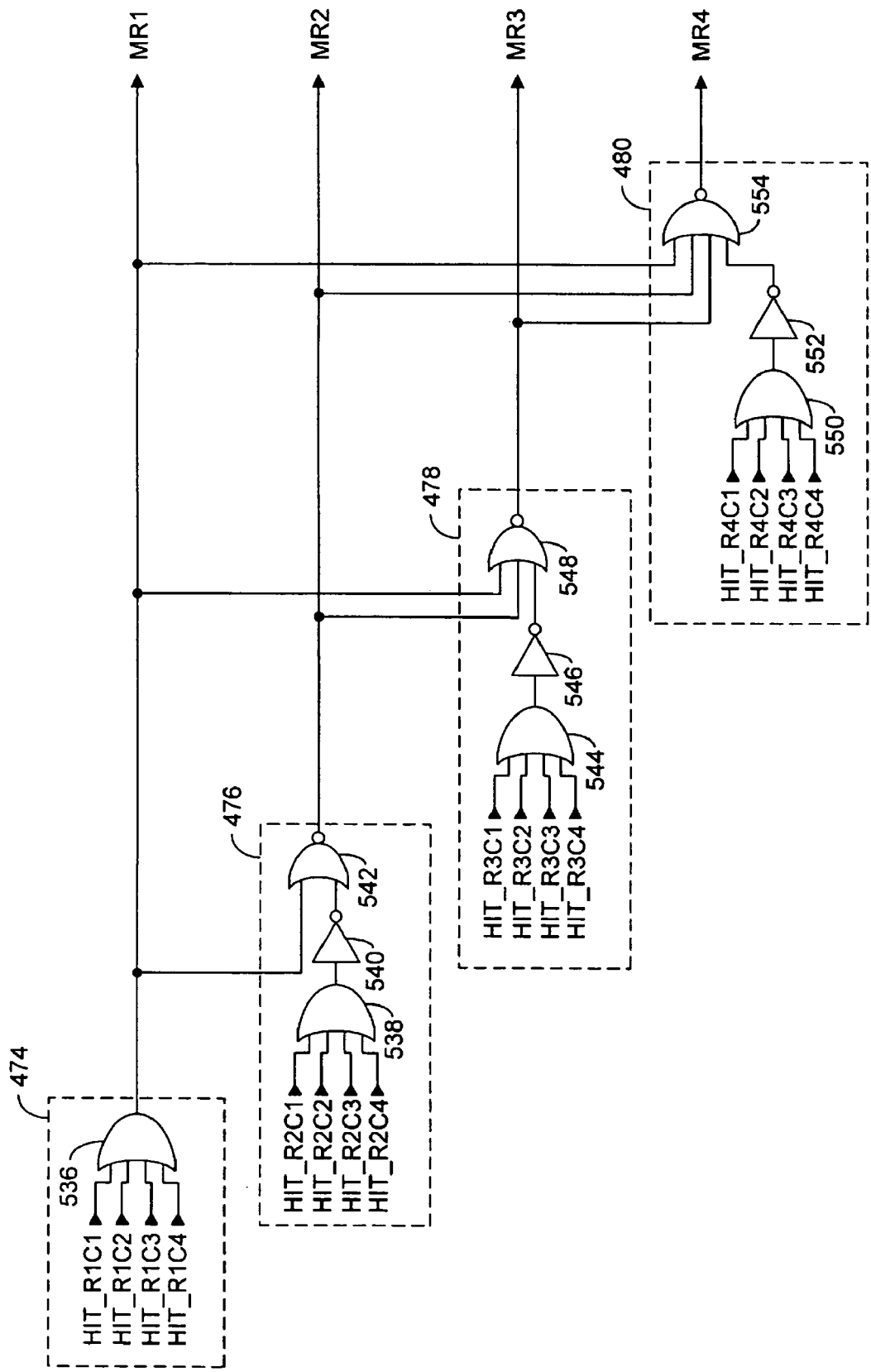
FIG. 9 shows a schematic of a row priority circuit from the priority encoder of FIG. 5.
Figure 10:
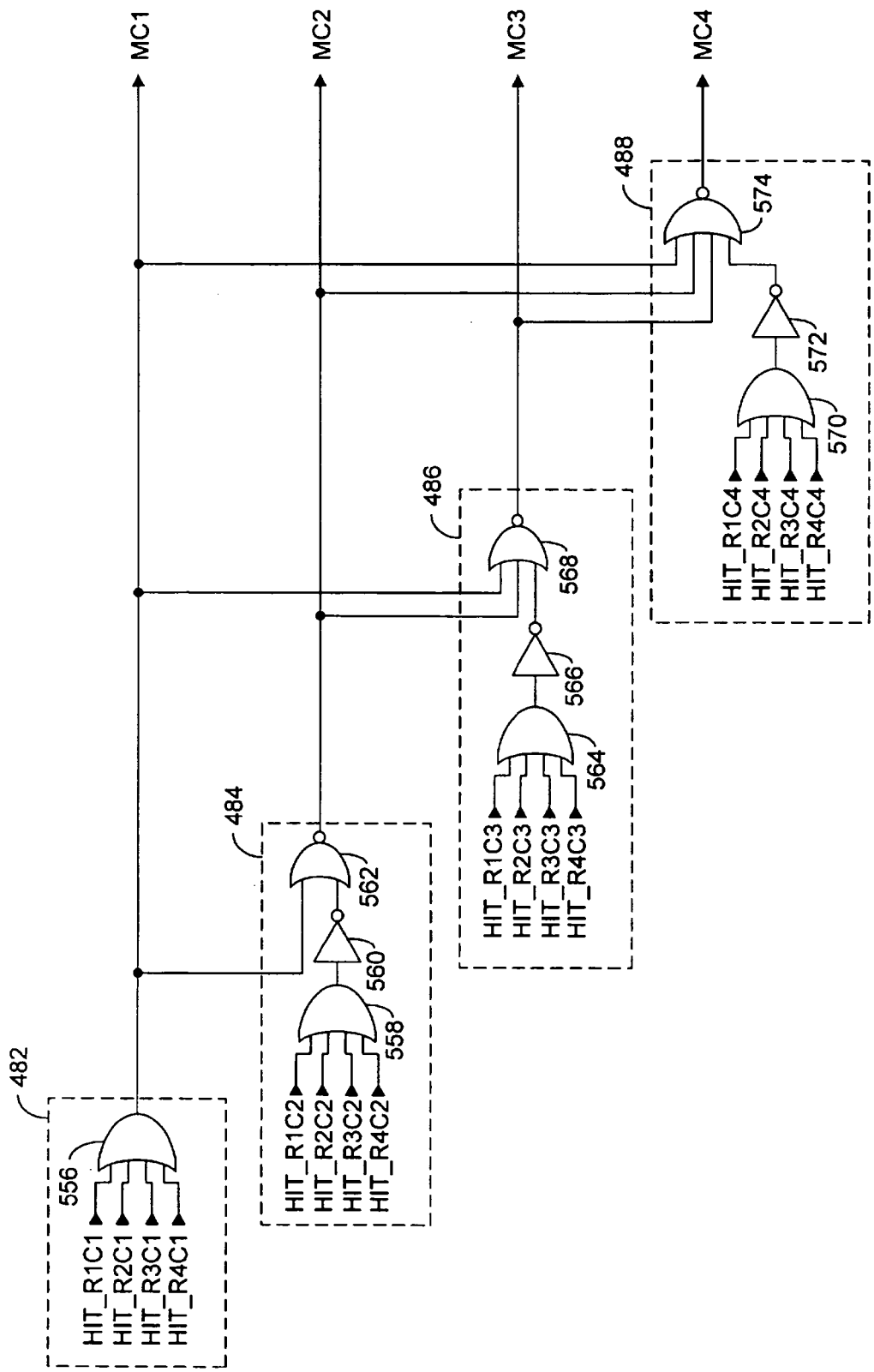
FIG. 10 shows a schematic of a column priority circuit from the priority encoder of FIG. 5.

FIG. 5 shows a general block diagram of a priority encoder for generating the lower address portion of a global address corresponding to the highest priority active matchline sense output signal received by the priority encoder, according to a second embodiment of the present invention. The lower address portion is the least significant bits of the global address. Priority encoder 470 consists of rows and columns of priority encoder units 490 organized into quadrants 472. Row priority logic blocks 474, 476, 478, 480 and column priority logic blocks 482, 484, 486, 488 are formed between the quadrants. Detailed circuit schematics of the row and column priority logic blocks are shown in FIGS. 9 and 10 respectively. In general, the row and column priority logic blocks determine the location of the priority encoder unit 490 which has received the highest priority matchline sense output signal. In this embodiment, each priority encoder unit 490 receives 256 matchline sense output signals for generation of a local eight bit address corresponding to the highest priority active matchline sense output signal received, and for generation of a flag signal to indicate that at least one active matchline sense output signal has been received. The priority encoder units 490 are organized such that the top-most row of priority encoder units 490 have the highest priority, with each subsequent row underneath having a lesser level of priority. Within the rows, the left-most column of priority encoder units 490 have the highest priority, with each subsequent column to the right having a lesser level of priority. Each row priority logic block receives the four flag signals from one associated row of priority encoder units 490, and generates master row signals MR1, MR2, MR3 and MR4. A master row signal becomes active when at least one of the four flag signals received is active. The interconnections of the row priority logic blocks ensures that any active master row signal from a higher priority row disables all master row signals from lesser priority rows. The operation of the row priority logic blocks will be discussed in more detail later. In an identical configuration, each column priority logic block receives the four flag signals from one associated column of priority encoder units 490, and generates master column signals MC1, MC2, MC3 and MC4. A master column signal becomes active when at least one of the four flag signals received is active. The interconnections of the column priority logic blocks ensures that any active master column signal from a higher priority column disables all master column signals corresponding to lesser priority columns. The operation of the column priority logic blocks will be discussed in more detail later. Therefore, in any priority encoding operation of the present embodiment, only one master row signal and one master column signal are active. Hence, a circuit (not shown) is used to encode the address of the priority encoder unit 490 which has received the highest priority active matchline sense output signal. This address is four bits wide since there are sixteen priority encoder units 490, and is the higher address portion, or most significant bits, of the global address of the highest priority active matchline sense output signal received by priority encoder 470. By example only, two multiple match resolver circuits 430 are used to encode the higher address portion of the global address. Master row signals MR4–MR1 are connected to the input ports ML3–ML0 respectively of one multiple match resolver circuit 430, for generating address bits A11 and A10 from output ports A1 and A0 respectively. Master column signals MC4–MC1 are connected to the input ports ML3–ML0 respectively of a second multiple match resolver circuit 430, for generating address bits A9 and A8 from output ports A1 and A0 respectively. With regards to the remaining input and output ports, the EN port is connected to an appropriate control signal, or tied to the high voltage supply, while the HIT, TBI, TBO and EN3–EN0 output ports remain unconnected. Although not shown, the output address ports of each priority encoder unit 490 are connected to common global address lines for providing the local eight bit address corresponding to the highest priority active matchline sense output signal received by priority encoder 470. This local eight bit address is the lower address portion of the global address. The architecture of priority encoder 470 is similar to the architecture of encoder unit 410 shown in FIG. 4. The first stage of priority encoding is performed by priority encoder units 490 for providing the eight lower address bits of the global address, followed by a second stage of priority encoding performed by the row and column priority logic blocks in conjunction with the aforementioned address encoders, for providing four higher address bits of the global address.

Figure 6:
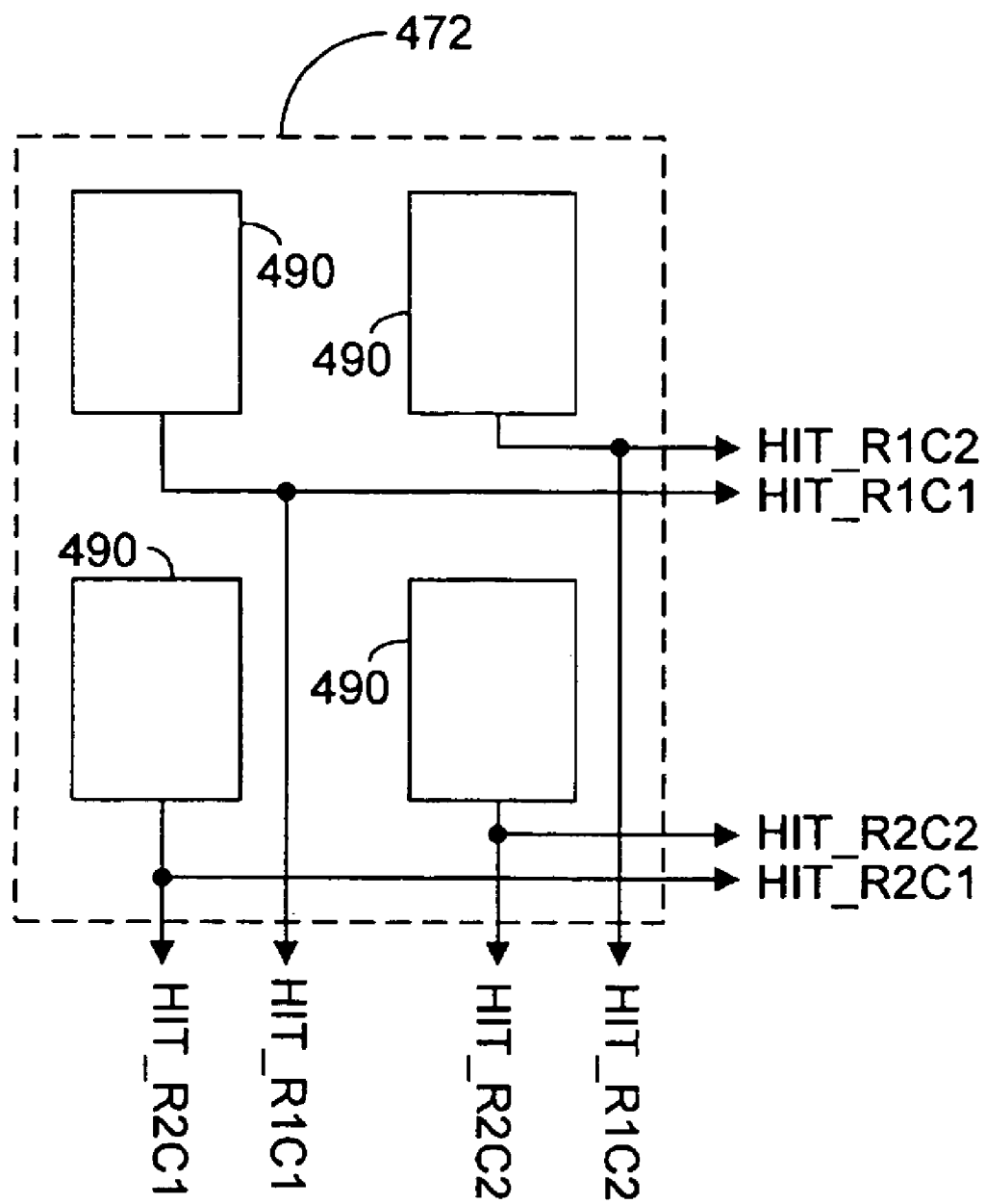
FIG. 6 shows a detailed view of one quadrant from the priority encoder of FIG. 5.

FIG. 6 shows a more detailed view of the top-left quadrant 472 from FIG. 5. Row flag signals HIT_R1C1, HIT_R1C2 are generated from priority encoder units 490 located at row 1, column 1 and row 1, column 2 respectively, and row flag signals HIT_R2C1, HIT_R2C2 are generated from priority encoder units 490 located at row 2, column 1 and row 2, column 2 respectively. With reference to FIG. 5, HIT_R1C1 and HIT_R1C2 are connected to row priority logic block 474, and HIT_R1C1 and HIT_R2C1 are connected to column priority logic block 482.

Figure 7:
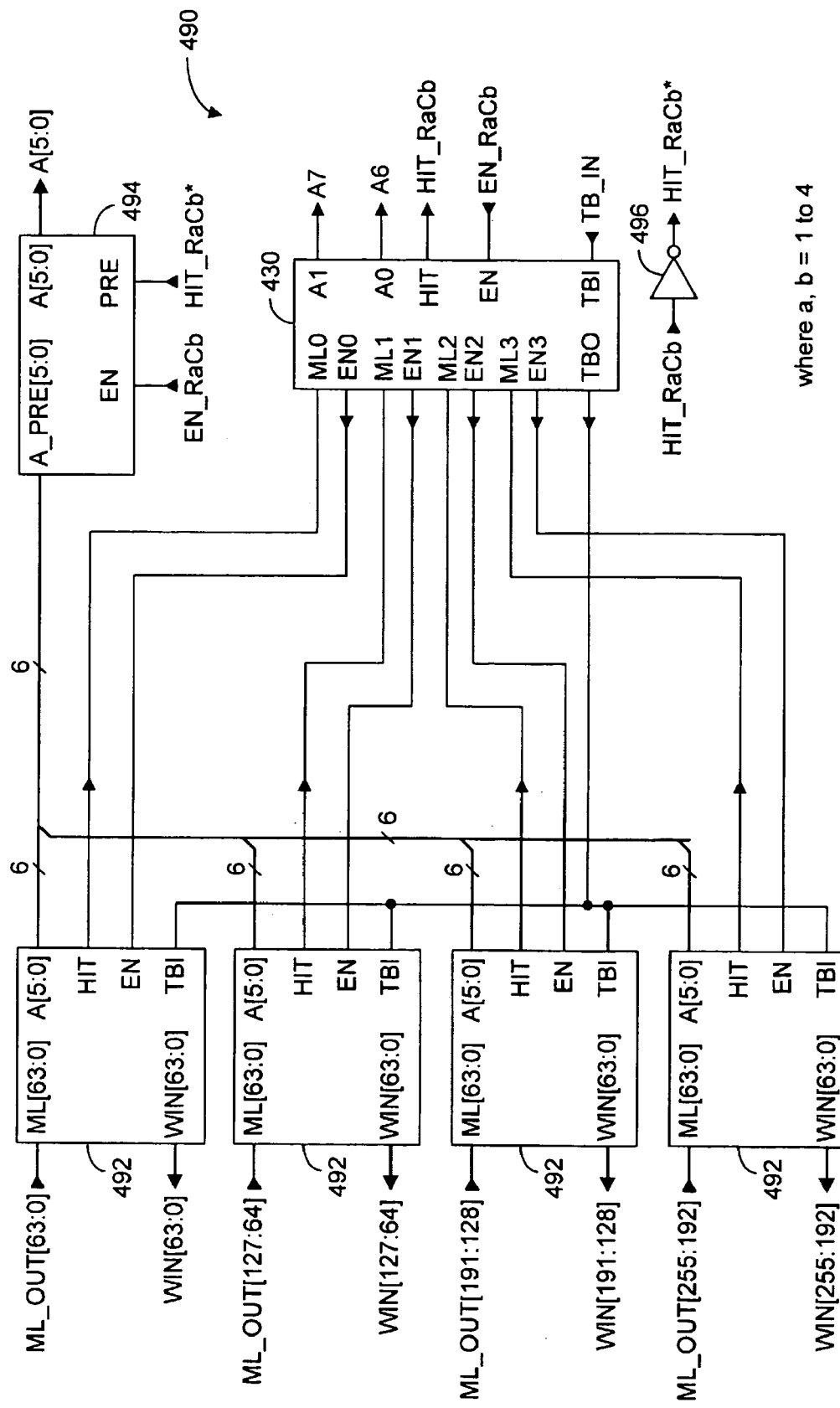
FIG. 7 shows a priority encoder unit according to a third embodiment of the present invention used in the priority encoder of FIG. 5.
Figure 11:
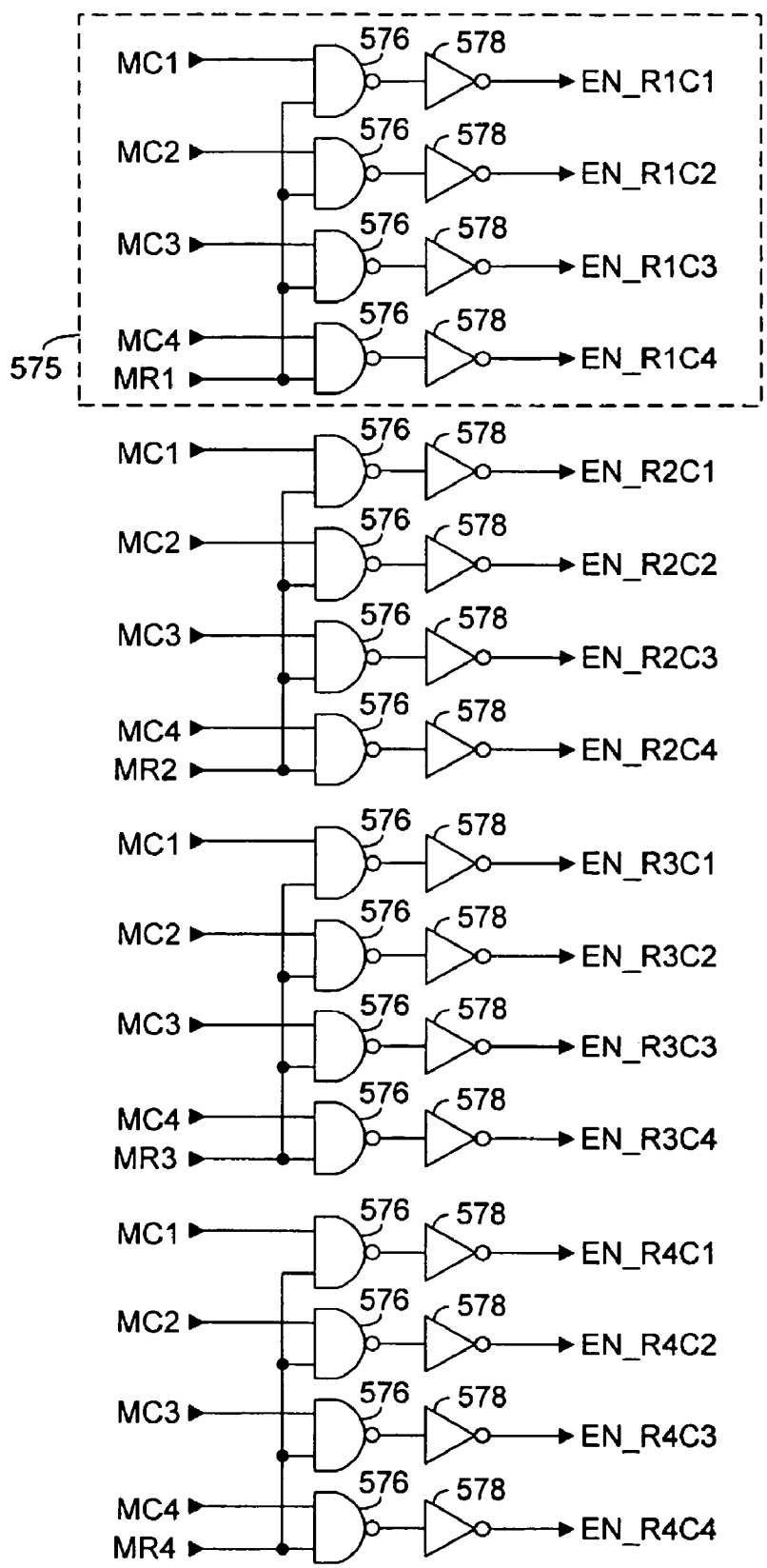
FIG. 11 shows a schematic of a master row and column signal decoder for use with the priority encoder of FIG. 5.

FIG. 7 is a block diagram of priority encoder unit 490 used in the priority encoder embodiment of FIG. 5, according to a third embodiment of the present invention. Priority encoder unit 490 is a larger scaled version of priority encoder unit 410 shown in FIG. 4, and accordingly, priority encoder unit 490 also functions as a larger scale multiple match resolver circuit. Priority encoder unit 490 receives 256 ML_OUT signals instead of the sixteen received by priority encoder unit 410, to provide a local eight bit address corresponding to the highest priority active matchline sense output signal received. In a configuration identical to that of FIG. 4, four multiple match resolver circuits 492 are arranged in parallel. In the present embodiment, each multiple match resolver circuit 492 consists of the smaller multiple match resolver circuits 430 from FIG. 4, arranged to accept 64 matchline sense output signals. It should be apparent to a person skilled in the art that multiple match resolver circuit 492 is constructed by scaling multiple match resolver circuits 430, or by assembling several multiple match resolver circuits 430 together, to accommodate the higher number of matchline sense output signals, for example. Each multiple match resolver circuit 492 receives a set of 64 ML_OUT signals, and generates a flag signal from the HIT output port and a six bit address A[5:0] corresponding to the highest priority active ML_OUT signal received. The six output address ports are each connected to their respective common address lines. The second stage multiple match resolver circuit 430 is the same circuit used in FIG. 4. Multiple match resolver circuit 430 receives the four flag signals to generate a higher order two bit address corresponding to the multiple match resolver circuit 492 which has received the highest priority active ML_OUT signal. Output ports EN0-EN3 are connected to the EN input port of each multiple match resolver circuit 492 to enable transfer of the lower order six bit address A[5:0] onto the common address lines. Output ports WIN[63:0] of multiple match resolver circuits 492 are derived from signals received at their TBI input ports, and are used to indicate which particular ML port has received the highest priority match globally during a search-and-output-all operation. In the search-and-output-all operation, all matching addresses are generated by the priority encoder in successive address generation cycles. The WIN[63:0] signals disable the highest priority matchline sense output signal in one address generation cycle so that another match address can be generated in the next address generation cycle. Output ports WIN[63:0] and its related circuits do not contribute to the address generation operation of multiple match resolver circuits 492, and are therefore not described in any further detail. Once an active flag is received by multiple match resolver circuit 430, row flag signal HIT_RaCb is generated and sent to corresponding row and column priority logic blocks shown in FIG. 5. Enable signal EN_RaCb is generated by the previously mentioned master row and column decoder circuit which is shown in FIG. 11 and discussed in further detail later. Subscript variables a and b can be any value from 1 to 4, thus providing one of sixteen distinct flag signals. Only the priority encoder unit 490 which receives the one active EN_RaCb signal is allowed to transfer its eight bit address. Buffer circuit block 494 functions identically to the circuit elements 411, 412 and 413 from FIG. 4, and passes the logic levels on the common address lines as lower address portion A5–A0. Input port A_PRE[5:0] receives the six common address lines, input ports EN and PRE receive EN_RaCb and HIT_RaCb* respectively, and output port A[5:0] provides lower addresses A5 to A0. Signal HIT_RaCb* is generated from inverter 496 for use in buffer circuit block 494. The detailed schematic of buffer circuit block 494 is shown in FIG. 8.

Figure 8:
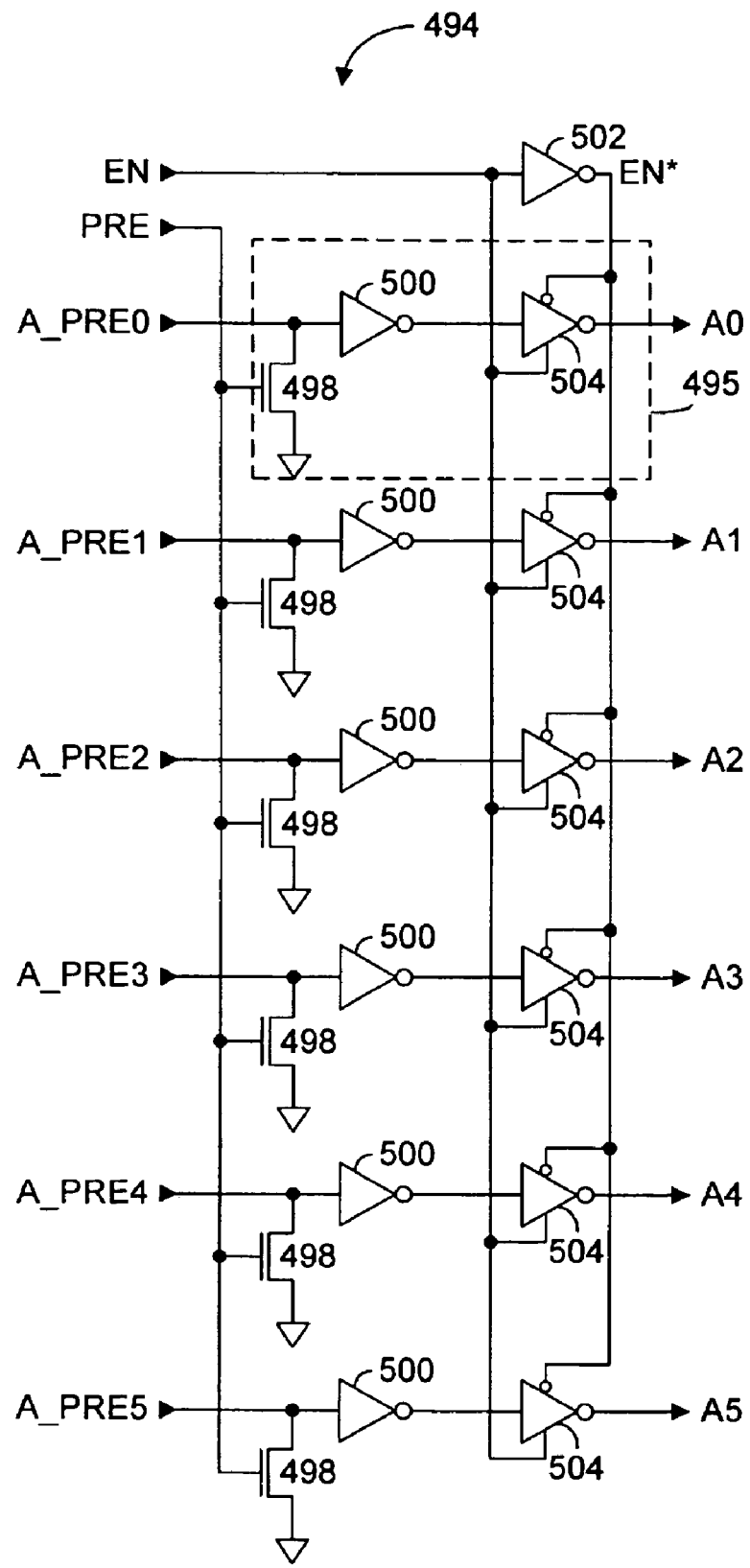
FIG. 8 shows a schematic of tri-state buffer from the priority encoder unit of FIG. 7.

FIG. 8 shows a detailed schematic of buffer circuit block 494 from FIG. 7. Each address input port A_PRE0 to A_PRE5 is connected to its respective common address line and individual buffer circuit 495 consisting of n-channel transistor 498, inverter 500 and tri-state inverter 504. It is noted that only one individual buffer circuit 495 is annotated as such in FIG. 8. Inverter 502 is connected to input port EN for generating inverted signal EN*. All n-channel transistors 498 have their gates connected in common to input port PRE for connecting respective address input ports to ground. The input to inverter 500 is connected to a respective address input port A_PRE and the output is connected to the input of tri-state inverter 504. Input port EN and signal EN* are connected in common to all tri-state inverters 504. Each tri-state inverter 504 provides an address signal, A0–A5, corresponding to address input ports A_PRE0-A_PRE5 respectively. N-channel transistor 498, inverter 500 and tri-state inverter 504, both correspond and function identically to n-channel transistor 411, inverter 412 and tri-state inverter 413 from FIG. 4. Buffer circuit block 494 only passes the logic level received at the address input port A_PRE[5:0] to the address output ports A[5:0] when input port EN receives a high logic level signal and input port PRE receives a low logic level signal. The individual buffer circuits 495 drive data from their input ports to their output ports when both HIT_RaCb and EN_RaCb are at the high logic levels.

FIG. 9 shows a circuit schematic of the row priority logic blocks 474, 476, 478 and 480 shown in FIG. 5. The row priority logic blocks identify the row of priority encoder units 490 that has received the highest priority matchline sense output signal by assessing the flag signals generated by each priority encoder unit 490 and generating one master row signal corresponding to that row of priority encoder units 490. Logic block 474 includes a four input OR gate 536 for receiving flag signals HIT_R1C1, HIT_R1C2, HIT_R1C3 and HIT_R1C4, generated by a respective priority encoder unit 490 of the first row, and for generating master row signal MR1. Logic block 476 includes a four input OR gate 538 for receiving flag signals HIT_R2C1, HIT_R2C2, HIT_R2C3 and HIT_R2C4, generated by a respective priority encoder unit 490 of the second row. The output of OR gate 538 is connected to the input of inverter 540. Two-input NOR gate 542 is connected to the output of inverter 540 and signal MR1 for generating master row signal MR2. Logic block 478 includes a four input OR gate 544 for receiving flag signals HIT_R3C1, HIT_R3C2, HIT_R3C3 and HIT_R3C4, generated by a respective priority encoder unit 490 of the third row. The output of OR gate 544 is connected to the input of inverter 546. Three-input NOR gate 548 is connected to the output of inverter 546 and signals MR1 and MR2 for generating master row signal MR3. Logic block 480 includes a four input OR gate 550 for receiving flag signals HIT_R4C1, HIT_R4C2, HIT_R4C3 and HIT_R4C4, generated by a respective priority encoder unit 490 of the fourth row. The output of OR gate 550 is connected to the input of inverter 552. Four-input NOR gate 554 is connected to the output of inverter 552 and signals MR1, MR2 and MR3 for generating master row signal MR4. OR gates 536, 538, 544 and 550 perform the same function of detecting at least one active flag signal from a respective row of priority encoder units 490. NOR gates 542, 548 and 554 over-write, or block, the intermediate master row signals generated at the outputs of OR gates 538, 544 and 550 respectively. Each master row signal, MR1–MR4, is associated with a respective row of priority encoder units 490. In the embodiment of FIG. 5, flag signals from the first row, HIT_R1C1-HIT_RlC4 have the highest priority, and in descending order, flag signals from the second, third and fourth rows have progressively lower priorities. Therefore, master row signal MR1 has the highest priority and master row signal MR4 has the lowest priority. The configuration of the row priority logic blocks ensures that only the highest priority master row signal of the four master row signals remains active. This is achieved by forward-feeding the higher priority master row signals to the NOR gates which generate lower priority master row signals. For example, if flag signals HIT_R2C1, HIT_R2C2, HIT_R3C1 and HIT_R4C1 are at the high logic level, then OR gates 538, 544 and 550 drive a high logic level output. Accordingly, MR1 is at the low logic level, and inverters 540, 546 and 552 present a low logic level on the inputs of respective NOR gates 542, 548 and 554. Since MR1 is at the low logic level, NOR gate 542 generates a high logic level MR2 signal. With MR2 at the high logic level, NOR gates 548 and 554 maintain lower priority master row signals MR3 and MR4 at the low logic level. Hence, the high logic level MR2 signal indicates that at least one priority encoder unit 490 of row two has received the highest priority matchline sense output signal. Because two flag signals of the same row are active, HIT_R2C1 and HIT_R2C2, additional information is required to determine which of the corresponding priority encoder units 490 has the highest priority. This additional information is provided by the column priority logic blocks shown in FIG. 10 described below.

FIG. 10 shows a circuit schematic of the column priority logic blocks 482, 484, 486 and 488 shown in FIG. 5. The column priority logic blocks identify the column of priority encoder units 490 that has received the highest priority matchline sense output signal by assessing the flag signals generated by each priority encoder unit 490 and generating one master column signal corresponding to that column of priority encoder units 490. The circuit elements and their configuration are identical to the row priority logic circuitry shown in FIG. 9. Logic block 482 includes a four input OR gate 556 for receiving flag signals HIT_R1C1, HIT_R2C1, HIT_R3C1 and HIT_R4C1, generated by a respective priority encoder unit 490 of the first column, and for generating master column signal MC1. Logic block 484 includes a four input OR gate 558 for receiving flag signals HIT_R1C2, HIT_R2C2, HIT_R3C2 and HIT_R4C2, generated by a respective priority encoder unit 490 of the second column. The output of OR gate 558 is connected to the input of inverter 560. Two-input NOR gate 562 is connected to the output of inverter 560 and signal MCi for generating master column signal MC2. Logic block 486 includes a four input OR gate 564 for receiving flag signals HIT_R1C3, HIT_R2C3, HIT_R3C3 and HIT_R4C3, generated by a respective priority encoder unit 490 of the third column. The output of OR gate 564 is connected to the input of inverter 566. Three-input NOR gate 568 is connected to the output of inverter 566 and signals MC1 and MC2 for generating master column signal MC3. Logic block 488 includes a four input OR gate 570 for receiving flag signals HIT_R1C4, HIT_R2C4, HIT_R3C4 and HIT_R4C4, generated by a respective priority encoder unit 490 of the fourth column. The output of OR gate 570 is connected to the input of inverter 572. Four-input NOR gate 574 is connected to the output of inverter 572 and signals MC1, MC2 and MC3 for generating master column signal MC4. OR gates 556, 558, 564 and 570 perform the same function of detecting at least one active flag signal from a respective column of priority encoder units 490. NOR gates 562, 568 and 574 over-write, or block, the intermediate master column signals generated at the outputs of OR gates 558, 564 and 570 respectively. Each master column signal, MC1–MC4, is associated with a respective column of priority encoder units 490. In the embodiment of FIG. 5, flag signals from the first column, HIT_R1C1–HIT_R4C1 have the highest priority, and in descending order, flag signals from the second, third and fourth columns have progressively lower priorities. Therefore, master column signal MC1 has the highest priority and master column signal MC4 has the lowest priority. The configuration of the column priority logic blocks ensures that only the highest priority master column signal of the four master column signals remains active. This is achieved by forward-feeding the higher priority master column signals to the NOR gates which generate lower priority master column signals. Continuing with the same example used in FIG. 9, if flag signals HIT_R2C1, HIT_R2C2, HIT_R3C1 and HIT_R4C1 are at the high logic level, then OR gates 556 and 558 drive a high logic level output. Accordingly, MC3 and MC4 are at the low logic level, and inverter 560 presents a low logic level on the input of respective NOR gate 562. Since MC1 is driven to the high logic level, NOR gate 562 maintains MC2 at the low logic level. Because a higher priority master column signal MC1 is active, all lower priority master column signals are automatically blocked, or disabled. Hence, the high logic level MC1 signal indicates that at least one priority encoder unit 490 of column one has received the highest priority matchline sense output signal. In this example, the priority encoder unit 490 which has received the highest priority matchline sense output signal is located at the intersection of row two, column one, as indicated by high logic level master row signal MR2 and high logic level master column signal MC1. The master row and column signals are subsequently encoded to provide the upper four bit portion of the twelve bit address corresponding to the logical location of the priority encoder unit 490 which has received the highest priority matchline sense output signal.

FIG. 11 shows an embodiment of a master row and column decoder circuit for selectively enabling one priority encoder unit 490 in the embodiment of FIG. 5. This decoder circuit receives the master row and column signals generated from FIGS. 9 and 10 and generates one active enable signal to allow one priority encoder unit 490 to pass its local eight bit address onto the common global address lines. The decoder circuit consists of four sub-blocks 575, each sub-block 575 receiving the four master column signals MC1–MC4 and a different one of the master row signals, for generating four enable signals. It is noted that only one sub-block 575 is annotated as such in FIG. 11. A sub-block 575 includes four, two input NAND gates 576, where the output of each NAND gate 576 is connected to the input of an inverter 578. The first input of each NAND gate 576 is connected in common to a master row signal MRa, and each of the four NAND gates 576 has a second input connected to master column signals MC1–MC4 respectively. The four inverters 578 of sub-block 575 generate enable signals EN_RaC1 to EN_RaC4, where a is a value corresponding to the position of the master row signal. In FIG. 11, each sub-block 575 is identical to the other, except that each receives a different master row signal. Referring back to the example used in FIGS. 9 and 10, if MR2 and MC1 are at the high logic levels, then only enable signal EN_R2C1 is driven to the high logic level. Hence, only priority encoder unit 490 connected to receive EN_R2C1 passes its local eight bit address to the common global address lines.

In the embodiment of FIG. 5, address encoding of the highest priority active matchline sense output signal is fast because both the row priority logic and the column priority logic operate in parallel and are implemented with simple, uncomplicated logic circuits. Furthermore, the central placement of the row and column priority logic within the array of priority encoders minimizes signal line capacitance to maximize speed. The global twelve bit address of the highest priority active matchline sense output signal is easily obtained by concatenating the higher four bit address portion provided by an address encoder (not shown) with the lower local eight bit address portion provided by the selected priority encoder unit 490. However, priority encoder 470 requires each priority encoder unit 490 to wait for the row and column priority logic to finish processing flag signals and drive one of the sixteen feedback enable signals EN_RaCb before passing the selected local eight bit address portion to the common global address lines. The sequential nature of the logic adds undesired processing time to the encoding operation.

Figure 12:
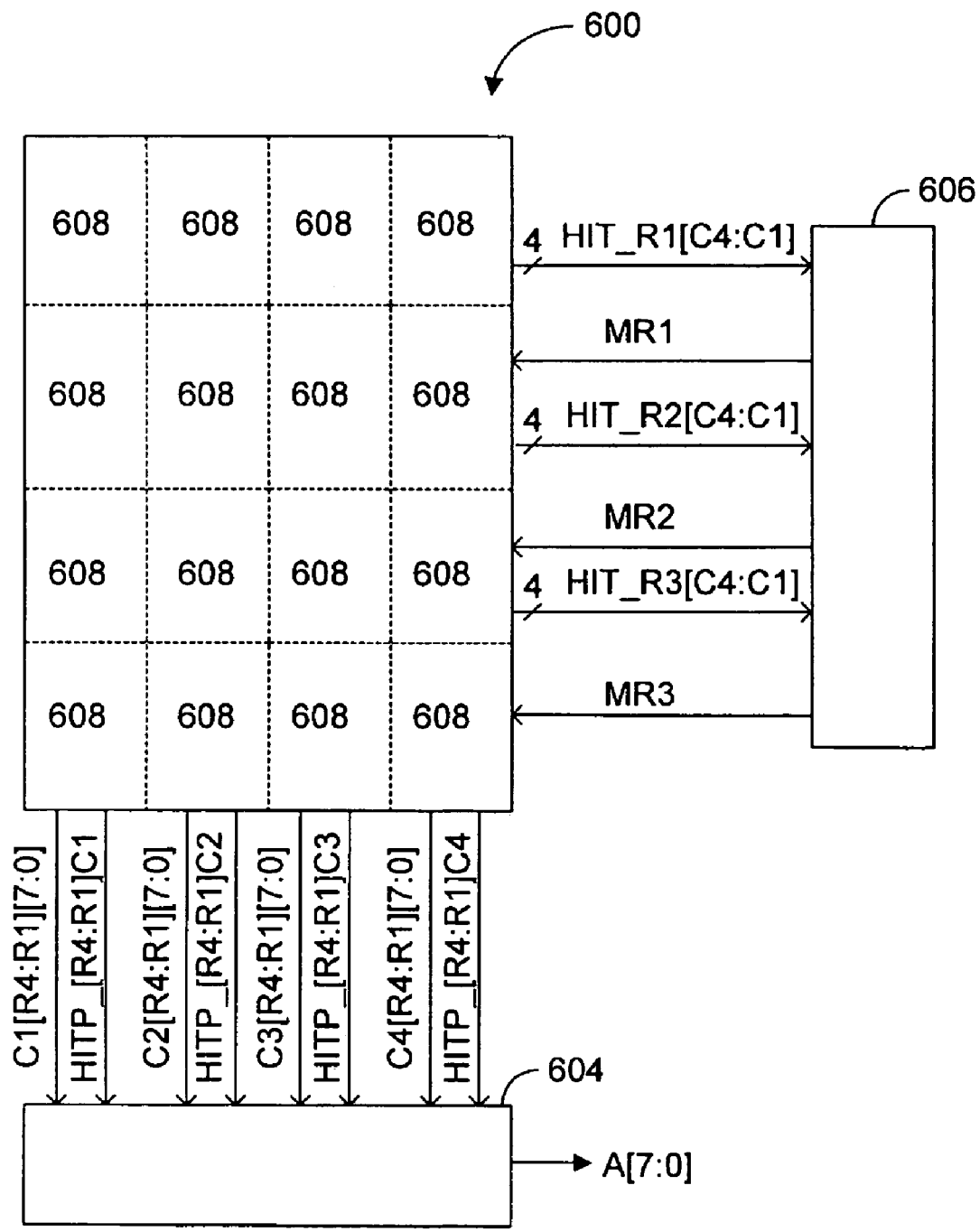
FIG. 12 shows a block diagram of a priority encoder according to a fourth embodiment of the present invention.

An improved priority encoder according to a fourth embodiment of the present invention is shown in FIG. 12. Priority encoder 600 eliminates the processing time delay of priority encoder 470 in FIG. 5 by simultaneously processing all flag and local address signals in parallel. Priority encoder 600 includes an array of priority encoder blocks 608 arranged in rows and columns. Every priority encoder block 608 receives matchline sense output signals and generates separate row and column flag signals, and a local address corresponding to the highest priority active matchline sense signal output received. Row control logic block 606 receives the row flag signals generated by each row of priority encoder blocks 608 for controlling local address and column flag signal generation by lower priority rows of priority encoder blocks 608. Column control logic block 604 receives the local addresses generated by each priority encoder block 608 and the column flag signals for passing a final local address. The final local address is the lower address portion of the global address corresponding to the highest priority active matchline sense output signal received among all priority encoder blocks 608. The row and column flag signals are processed to generate the logical address of the priority encoder block 608 which has received the highest priority active matchline sense output signal received among all priority encoder blocks 608. This logical address is the higher address portion of the global address. The priority assignment scheme of the priority encoder blocks 608 is identical to the scheme for the embodiment shown in FIG. 5. The top-most, or first, row of priority encoder blocks 608 has the highest priority, and each successive row of priority encoder blocks 608 has a lesser priority than the row above it. The left-most, or first, column of priority encoder blocks 608 has the highest priority, and each successive column of priority encoder blocks 608 has a lesser priority than the column to its left. Hence in this scheme, the priority encoder block 608 at the top-left corner has the highest priority, and the priority encoder block 608 at the bottom-right corner has the lowest priority.

In general operation, priority encoder blocks 608 of a row receiving active matchline sense output signals generates row and column flag signals and a local address. Priority encoder blocks 608 which have not received active matchline sense output signals generate a null value local address. All lower priority rows of priority encoder blocks 608 are immediately disabled such that they generate inactive column flag signals and the null value local address. A null value local address has all bits set to zero for example. Hence, only the local addresses and column flag signals generated by the priority encoder blocks 608 of the highest priority row remain active. The highest priority column of priority encoder blocks 608 which has received active matchline sense output signals is determined. The local addresses generated by all the lower priority columns are set to the null value, and the remaining valid local address becomes the lower portion of the global address of the highest priority active matchline sense output signal. The specific embodiment of FIG. 12 is now described. Each priority encoder block 608 receives 256 matchline sense output signals and generates an eight bit local address corresponding to the highest priority active matchline sense output signal received. For example, the highest priority, priority encoder block 608 at row 1, column 1 generates local address C1R1[7:0], and the lowest priority, priority encoder block 608 at row 4, column 4 generates local address C4R4[7:0]. Each priority encoder block 608 also generates a row flag signal and a column flag signal. Priority encoder block 608 at row 1, column 1 generates row flag signal HIT_R1C1 and column flag signal HITP_R1C1. Row control block 606 receives three groups of four row flag signals, HIT_R1[C4:C1], HIT_R2[C4:C1] and HIT_R3[C4:C1] from the first to third rows of priority encoder blocks 608 respectively. Master row signals MR1, MR2 and MR3 corresponding to each group of row flag signals are provided for rows 2, 3 and 4 respectively. Master row signal MR4 is generated by row control block 606, but is used for other functions, such as for encoding the upper portion of the global address. Row control block 606 includes circuits identical to the circuits shown in FIG. 9, which has been previously described in detail. Therefore, further description of row control block 606 is not necessary. Column control logic block 604 receives the local addresses C1[R4:R1][7:0] to C4[R4:R1][7:0] from columns 1 to 4 respectively, and column flag signals HITP_[R4:R1]C1 to HITP_[R4:R1]C4 from columns 1 to 4 respectively, and provides a final eight bit local address A[7:0]. To clarify the notation, C1[R4:R1][7:0] denotes four parallel sets of local eight bit addresses for column 1, each set originating from a different row of priority encoder blocks 608. HITP_[R4:R1]C1 denotes four column flag signals for column 1, each column flag signal originating from a different row of priority encoder blocks 608. The circuit schematic for column control logic block 604 is shown in FIG. 14, and described in further detail later. The purpose of row control logic block 606 is to disable all lower priority rows of priority encoder blocks 608 after the highest priority row of priority encoder blocks 608 is determined, via the master row signals. Further detail regarding the relationship between the master row signals and local address and column flag generation is discussed later with reference to FIG. 13. Therefore, row 1, being the highest priority, does not receive a master row signal from row control logic block 606 for disabling its priority encoders 608. Row 4, being the lowest priority, does not provide row flag signals to row control logic block 606 since there are no other rows of lower priority which need to be disabled if active matchline sense output signals are only received in row 4. The purpose of column control logic block 606 is to disable the local addresses generated by all lower priority columns of priority encoder blocks 608 after the highest priority column of priority encoder blocks 608 is determined, via the column flag signals.

Figure 13:
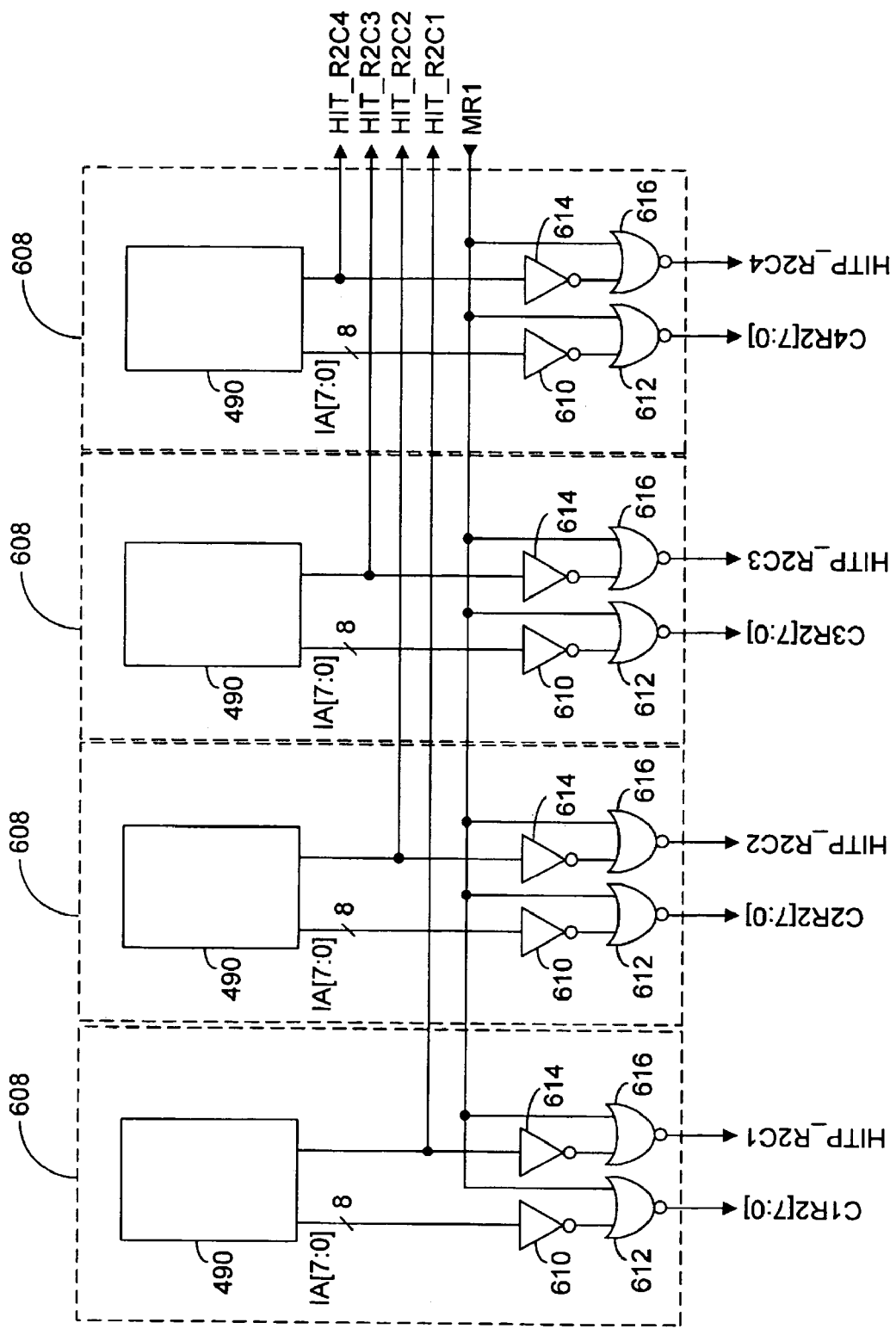
FIG. 13 shows a detailed view of one row from the priority encoder of FIG. 12.
Figure 14:
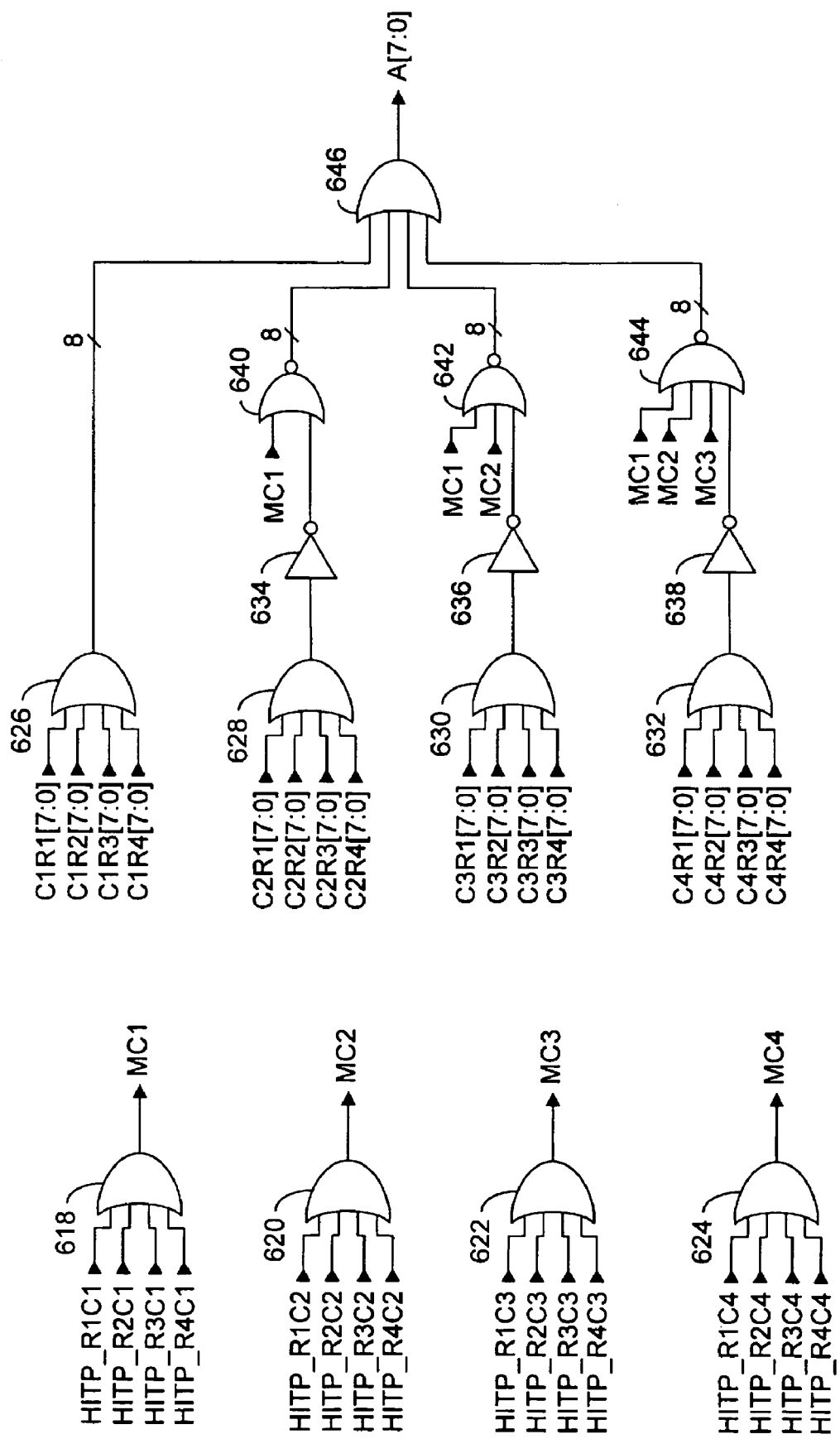
FIG. 14 shows a schematic of a priority address resolver circuit from the priority encoder of FIG. 12; and, FIG. 15 shows a schematic of a combined OR gate from FIG. 14.

FIG. 13 shows a block diagram of the second row of priority encoder blocks 608 from FIG. 12. Specifically shown are the circuits for controlling local address and column flag signal generation in each of the four priority encoder blocks 608, and their connection to master row signal MR1. As previously mentioned, the left-most priority encoder block 608 has the highest priority while the right-most priority encoder block 608 has the lowest priority, however, the priority encoder blocks 608 are identical to each other. The left-most priority encoder block 608 includes a priority encoder unit 490 for receiving 256 matchline sense output signals, and generates an intermediate eight bit address IA[7:0] corresponding to the highest priority active matchline sense output signal received, and a row flag signal HIT_R2C1. Priority encoder unit 490 is also used in priority encoder 470 shown in FIG. 5, and its circuit schematic is shown in FIG. 7. The input of inverter 610 is connected to intermediate eight bit address IA[7:0], and the output of inverter 610 is connected to one input of NOR gate 612. Row flag signal HIT_R2C1 is connected to the input of inverter 614, and the output of inverter 614 is connected to one input of NOR gate 616. Master row signal MR1 is connected to the second inputs of NOR gates 612 and 616. NOR gates 612 and 616 generate local eight bit address C1R2[7:0] and column flag signal HITP_R2C1 respectively. In the present embodiment, row and column flag signals are separately generated, unlike in FIG. 6 where row and column flag signals are the same. It is noted that inverter 610 represents eight identical inverters connected in parallel, each being connected to a different one of the eight intermediate address bits. Accordingly, NOR gate 612 represents eight identical NOR gates, each having one input connected to the output of one of the previously mentioned inverters 610, for driving one of the eight local address bits. It is noted that input port EN of all priority encoder units 490 (FIG. 7) for receiving signal EN_RaCb are either connected to a common system control signal, or wired to a high voltage supply in the present embodiment. Unlike the embodiment of FIG. 5, all priority encoder units 490 release their intermediate eight bit addresses simultaneously once the encoding operation begins. All the rows are constructed identically, with the exception of row one. Since there are no higher priority rows than row one, NOR gates 612 and 616 do not receive a master row signal, and are enabled at all times. This can be done by wiring the second inputs of NOR gates 612 and 616 to the high voltage supply, for example.

In operation, it is the master row signal MR1 which allows the priority encoder blocks 608 of the row to generate their respective local eight bit addresses and column flag signals, if at least one of their priority encoder units 490 has received an active matchline sense output signal. As previously described for FIG. 9, MR1 becomes active when at least one of the row flag signals from row one are active. When MR1 is active, or at the high logic level, all NOR gates 612 and 616 receiving MR1 output low logic level signals. In other words, all priority encoder blocks 608 of row two are disabled. Otherwise, if MR1 was inactive at the low logic level, then all priority encoder blocks 608 of row two are allowed to generate, or pass, their respective local eight bit addresses and column flag signals to the column control logic block 604 for further processing.

Figure 15:
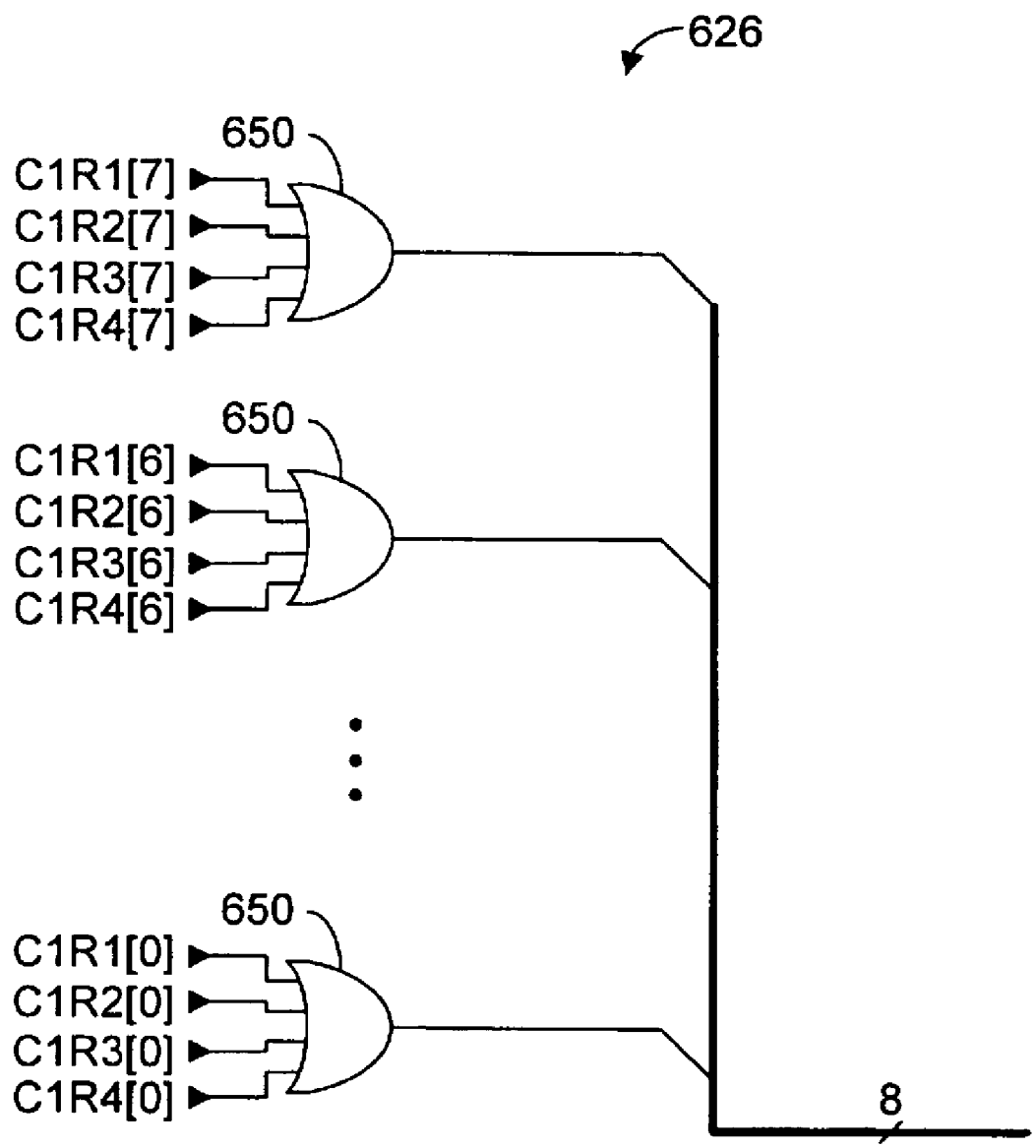

FIG. 14 shows the circuit schematic of the column control block 604 used in the priority encoder embodiment of FIG. 12. Column control block 604 receives the column flag signals and local eight bit addresses generated by the priority encoder blocks 608 from the four columns. Because all lower priority local eight bit addresses generated by lower priority rows of priority encoder blocks 608 are disabled by the row control logic block 606 through the master row signals, only one row of priority encoder blocks 608 remains active. Therefore, column control block 604 performs a one of four local eight bit address selection. The column flag signals and local eight bit addresses are internally grouped into sets corresponding to the column of priority encoder blocks 608 from which they originate. For example, HITP_R1C1 to HITP_R4C1 form one set of column flag signals, and C1R1[7:0] to C1R4[7:0] form one set of local eight bit addresses corresponding to column 1. Column control block 604 includes OR gates 618, 620, 622 and 624 for receiving column flag signals, and for generating master column signals MC1, MC2, MC3 and MC4 respectively. OR gate 618 receives the set of column flag signals consisting of HITP_R1C1, HITP_R2C1, HITP_R3C1 and HITP_R4C1. OR gate 620 receives the set of column flag signals consisting of HITP_R1C2, HITP_R2C2, HITP_R3C2 and HITP_R4C2. OR gate 622 receives the set of column flag signals consisting of HITP_R1C3, HITP_R2C3, HITP_R3C3 and HITP_R4C3. OR gate 624 receives the set of column flag signals consisting of HITP_R1C4, HITP_R2C4, HITP_R3C4 and HITP_R4C4. In accordance with the assigned priority of the columns, master column signal MC1 has the highest priority, and master column signals MC2 to MC4 have successively lower priorities. Column control logic block 604 also includes an address selection circuit for performing the one of four local eight bit address selection. OR gate 626 receives the set of local eight bit addresses consisting of C1R1[7:0], C1R2[7:0], C1R3[7:0] and C1R4[7:0] and has an output connected to one input of OR gate 646. OR gate 628 receives the set of local eight bit addresses consisting of C2R1[7:0], C2R2[7:0], C2R3[7:0] and C2R4[7:0], and has an output connected to the input of inverter 634. OR gate 630 receives the set of local eight bit addresses consisting of C3R1[7:0], C3R2[7:0], C3R3[7:0] and C3R4[7:0], and has an output connected to the input of inverter 636. OR gate 632 receives the set of local eight bit addresses consisting of C4R1[7:0], C4R2[7:0], C4R3[7:0] and C4R4[7:0], and has an output connected to the input of inverter 638. The inputs of blocking NOR gate 640 are connected to the output of inverter 634, and signal MC1. The inputs of blocking NOR gate 642 are connected to the output of inverter 636, and signals MC1 and MC2. The inputs of blocking NOR gate 644 are connected to the output of inverter 638, and signals MC1, MC2 and MC3. The inputs of OR gate 646 are connected to the outputs of OR gate 626 and NOR gates 640, 642 and 644 for passing the final local eight bit address A[7:0]. MC4 is not used within column control block 604, but is used by an additional circuit for generating the higher address portion of the global address, as would signals MC1, MC2 and MC3, for example. Although logic elements 626 through 646 are shown as single gates, each logic element represents eight identical instances of the elements connected in parallel. For example, the first instance of logic elements 626 through 646 processes the first address bits of the local eight bit addresses. FIG. 15 shows a detailed schematic showing the circuit arrangement of OR gate 626. When active column flag signals are received, the corresponding master column signals are driven to the high logic level by OR gates 618, 620, 622 and 624. Occurring at the same time, the local eight bit addresses are received by OR gates 626, 628, 630 and 632. Since only one row of priority encoder blocks 608 is active, each OR gate 626, 628, 630 and 632 receives at most one active local eight bit address. The configuration of blocking NOR gates 640, 642 and 644 within the address selection circuit ensures that only the local eight bit address corresponding to the highest priority active column flag signal passes as the final local eight bit address A[7:0]. This is achieved by connecting all the higher priority master column signals to all blocking NOR gates coupled to the OR gates which receive local eight bit addresses provided by lower priority columns of priority encoder blocks 608. Hence, any active master column signal causes all blocking NOR gates it is connected to, to generate a low logic level output for blocking passage of local eight bit addresses provided by lower priority columns. For example, if column flag signals HITP_R2C1, HITP_R2C2, HITP_R2C3 and HITP_R2C4 are in the active high logic level, then master column signals MC1, MC2, MC3 and MC4 are driven to the high logic level. It also follows that local eight bit addresses C1R2[7:0], C2R2[7:0], C3R2[7:0] and C4R2[7:0] are active. The high logic level MC1 signal forces NOR gates 640, 642 and 644 to output a low logic level. Therefore, the lower priority local eight bit addresses C2R2[7:0], C3R2[7:0] and C4R2[7:0], are block from reaching OR gate 646. However, C1R2[7:0], the highest priority local eight bit address, is passed to OR gate 646, which is then passed to the output A[7:0]. As previously described for the priority encoder embodiment of FIG. 5, multiple match resolver circuits 430 receive master row and column signals for encoding the address of the priority encoder block 608 which has received the highest priority active matchline sense output signal. This address is four bits wide since there are sixteen priority encoder blocks 608, and is the higher address portion, or most significant bits, of the global address of the highest priority active matchline sense output signal received by priority encoder 600.

FIG. 15 shows circuit details of OR gate 626 from FIG. 14. OR gate 626 consists of eight OR gates 650 arranged in parallel for receiving local eight bit addresses from the four priority encoder blocks 608 of column 1. Specifically, each OR gate 650 receives one address signal from a priority encoder block 608 of a different row, and the four address signals are from the same address bit position. For example, one OR gate 650 receives address bits C1R1[7], CIR2[7], C1R3[7] and C1R4[7]. These four address signals each originate from a different row, and carry the logic levels for bit position 7. Similarly, C1R1[0], C1R2[0], C1R3[0] and C1R4[0] carry the logic levels for bit position 0. As previously stated, since only one row of priority encoder blocks 608 is active, each OR gate 650 receives only one active address signal because the remaining address signals have been set to the null value.

Figure 1:
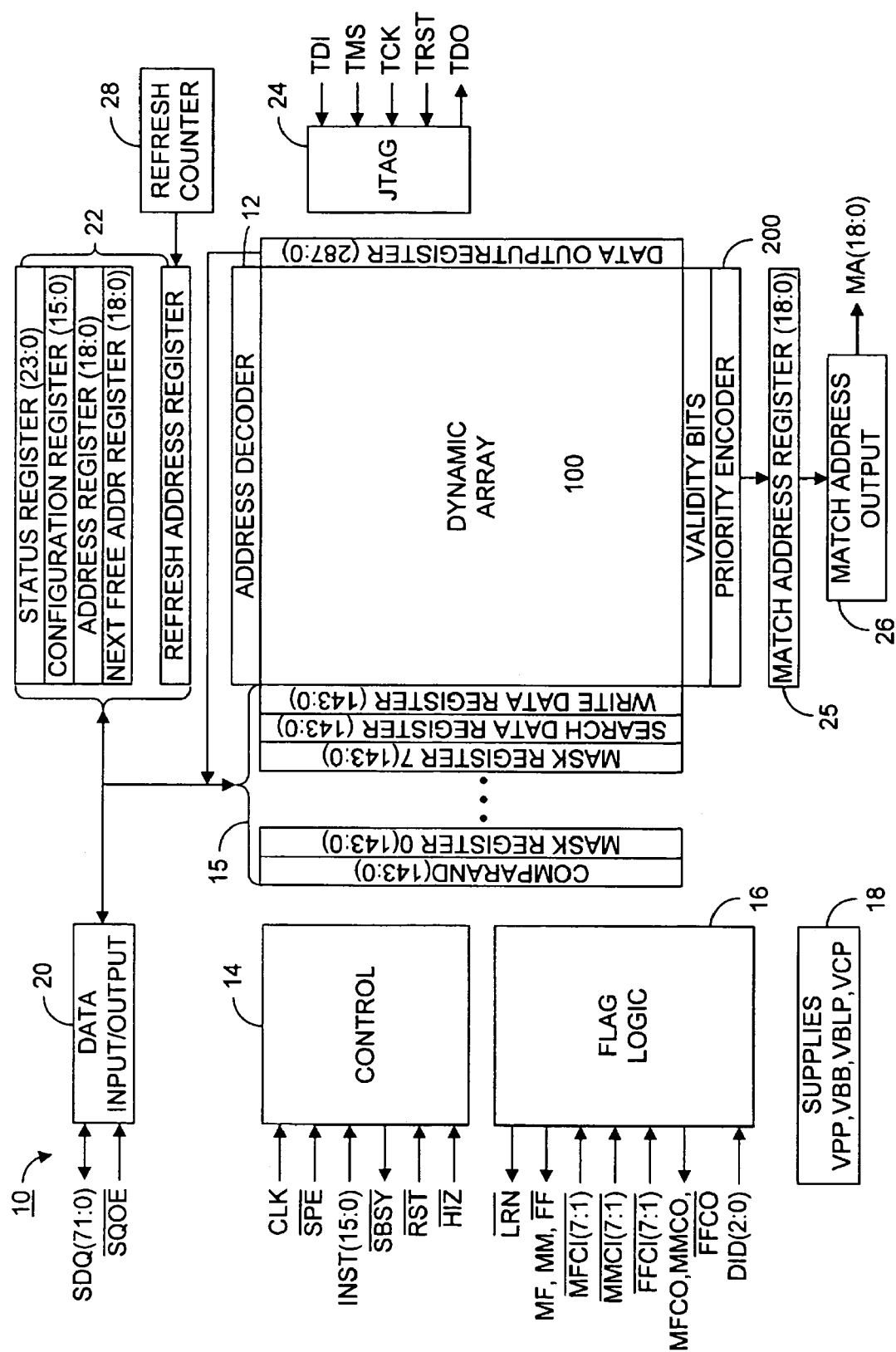
FIG. 1 shows a block diagram of a CAM according to an embodiment of the present invention.
Figure 2:
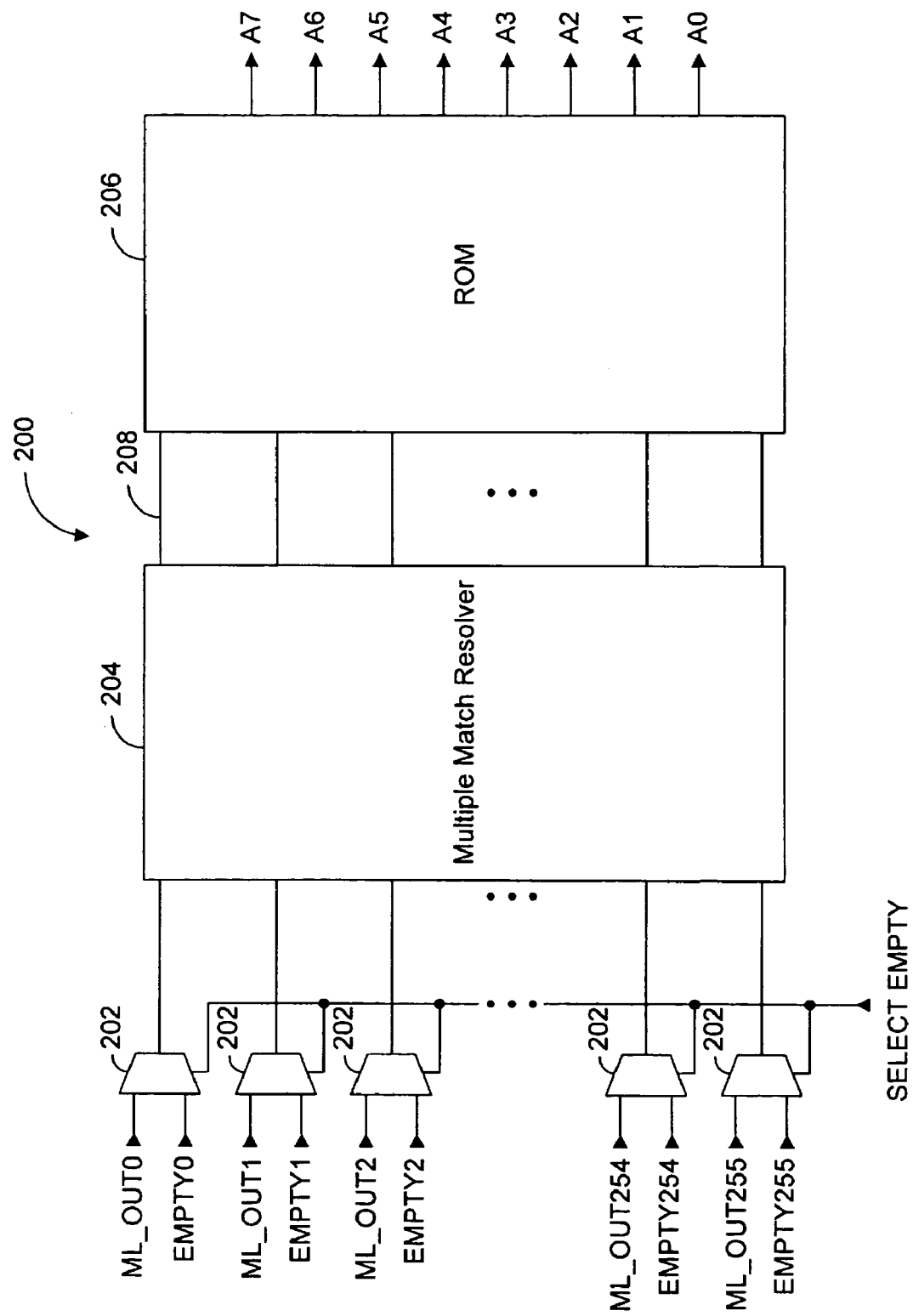
FIG. 2 shows a block diagram of a priority encoder of the prior art.

Simulations of the priority encoder embodiment of FIG. 12 show that the time required for output of the highest priority matchline sense output signal address after matchline sense output signals are presented to the priority encoder, is about 5 ns. The previously implemented priority encoder of FIG. 2 required 12 ns. Therefore, the speed advantage of the priority encoder of the present invention is significant, and contributes to improved CAM speed performance.

The embodiment of the priority encoder shown in FIG. 12 is implemented with simple logic circuits to achieve fast operation. Additionally, the row and column logic processes flag signals and addresses in parallel such that the lower portion of the global address corresponding to the highest priority matchline sense output signal is generated with high speed.

While the preceding description of a priority encoder circuit is made with reference to a DRAM-based CAM, it will be apparent to those of skill in the art that the circuits and techniques herein described can be equally applied to other CAM such as SRAM based CAM, to achieve higher operational speeds. Alternatively, the row and column logic blocks of FIG. 12 can be arranged centrally within the array of priority encoder blocks, as shown in the embodiment of FIG. 5, to reduce signal line capacitance and improve speed. Priority encoder units can be implemented as standard cells as small as the multiple match resolver circuit of FIG. 3, or as larger circuits which are scaled for receiving $2^n$ data signals to accommodate larger density CAM devices with minimum design overhead. The priority of the rows and columns of the array do not have to follow a progressively descending or ascending pattern. The priority assignments can be mixed without affecting performance.

The above-described embodiments of the invention are intended to be examples of the present invention. Alterations, modifications and variations may be effected the particular embodiments by those of skill in the art, without departing from the scope of the invention which is defined solely by the claims appended hereto.

We claim:

1. A priority encoder for generating a global address of a highest priority match signal from a plurality of match signals, comprising:

a plurality of match resolver circuits for generating a plurality of local match addresses in response to the plurality of match signals, each of the plurality of local match addresses having a distinct priority level; and, a logic circuit for determining an address of a highest priority level local match address, and for generating a feedback enable signal corresponding to the highest priority level local match address for enabling transfer of the highest priority level local match address from one of the plurality of match resolver circuits, the global address being a concatenation of the address and the highest level priority local match address.

2. The priority encoder of claim 1, wherein each of the plurality of match resolver circuits receives a set of the plurality of match signals for generating one local match address corresponding to the highest priority level match signal and one flag signal corresponding to the distinct priority level of the one local match address.

3. The priority encoder of claim 2, wherein the logic circuit includes a further match resolver circuit for receiving the flag signals from the plurality of match resolver circuits and generating the address of a highest priority level flag signal.

4. The priority encoder of claim 1, wherein each of the plurality of match resolver circuits is coupled to common address lines for carrying the highest priority level local match address.

5. The priority encoder of claim 4, wherein the feedback enable signal enables the one of the plurality of match resolver circuits to drive the common address lines with the highest priority level local match address.

6. The priority encoder of claim 5, wherein each of the plurality of match resolver circuits includes
   an input circuit for receiving a set of the plurality of match signals in an order of priority and for generating corresponding intermediate outputs and the one flag signal,
   a masking circuit for disabling the intermediate outputs corresponding to match signals having a priority level lower than a highest priority match signal, and,
   an address encoding circuit for receiving the intermediate outputs and for generating the local match address corresponding to the highest priority match signal.

7. The priority encoder of claim 6, wherein the address encoding circuit includes a tri-state buffer for driving the address onto the common address lines in response to a feedback enable signal.

8. A method for determining a global address of a highest priority level match signal from a plurality of match signals, comprising:
   a) generating a plurality of local match addresses in response to the plurality of match signals, each local match address having a predetermined priority level and an address corresponding to a source of generation of the local match address;
   b) determining a highest priority level local match address from the plurality of local match addresses;
   c) generating a feedback enable signal corresponding to the highest priority level local match address for enabling transfer of the highest priority level local match address; and
   d) concatenating the highest priority level local match address to the address to provide the global address.

9. The method of claim 8, wherein the step of generating includes providing a set of the plurality of match signals to a corresponding match resolver circuit, the corresponding match resolver circuit providing the local match address corresponding to a highest priority level match signal of the set of match signals.

10. The method of claim 8, wherein the step of generating includes generating a flag signal corresponding to each generated local match address, each flag signal having the predetermined priority level.

11. The method of claim 10, wherein the step of determining includes receiving flag signals for determining a highest priority flag signal.

12. The method of claim 11, further including a step of enabling a match resolver circuit corresponding to the highest priority flag signal to provide the local match address of the highest priority flag signal.

13. The method of claim 8, wherein the local match address is a lower significant portion of the global address and the address is a higher significant portion of the global address.

* * * * *